United States Patent [19]
Okamoto

[11] Patent Number: 5,411,823
[45] Date of Patent: May 2, 1995

[54] EXPOSURE METHOD, PHASE SHIFT MASK USED IN THE SAME, AND PROCESS OF FABRICATING SEMICONDUCTOR INTEGRATED CIRCUIT DEVICE USING THE SAME

[75] Inventor: Yoshihiko Okamoto, Shin, Japan

[73] Assignee: Hitachi, Ltd., Tokyo, Japan

[21] Appl. No.: 161,462

[22] Filed: Dec. 6, 1993

[30] Foreign Application Priority Data

Dec. 18, 1992 [JP] Japan .................................. 4-338477
Aug. 26, 1993 [JP] Japan .................................. 5-211180

[51] Int. Cl.$^6$ .............................................. G03F 9/00
[52] U.S. Cl. .......................................... 430/5; 430/311; 430/312; 430/314
[58] Field of Search ..................... 430/5, 311, 312, 314

[56] References Cited

U.S. PATENT DOCUMENTS 5,302,477  4/1994  Dao et al. ................................ 430/5

FOREIGN PATENT DOCUMENTS 67514    3/1987  Japan .
50811   10/1987  Japan .
140743   5/1990  Japan .
252659  11/1991  Japan .

Primary Examiner—S. Rosasco
Attorney, Agent, or Firm—Antonelli, Terry, Stout & Kraus

[57] ABSTRACT

A phase shift reducing projection exposure method for making it easy to make the pattern data of a phase shift mask capable of improving the focal depth of a transfer exposure plane and the resolution of a pattern. The exposure method comprises: a first enlarging step of making the data of a primary transparent pattern by enlarging the width of repeating patterns to a predetermined extent under a process condition without changing the relative position coordinates of the repeating patterns when the pattern data on the phase shift mask are to be made; and a second enlarging step of making the data of an auxiliary transparent pattern by enlarging the width of the primary transparent pattern obtained in the data status by the first enlarging step to a predetermined extent on the basis of the characteristic conditions of a reducing projection exposure optical system, and subsequently by eliminating the data of the primary transparent pattern from the data of the enlarged primary transparent pattern.

20 Claims, 19 Drawing Sheets

EXPOSURE METHOD, PHASE SHIFT MASK USED IN THE SAME, AND PROCESS OF FABRICATING SEMICONDUCTOR INTEGRATED CIRCUIT DEVICE USING THE SAME

BACKGROUND OF THE INVENTION

The present invention relates to an exposure method, a phase shift mask used in the same, and a process for fabricating a semiconductor integrated circuit device using the same. More particularly, the present invention relates to a technology which is effective if applied to an exposure technology using a phase shift mask for imparting a phase difference in an exposing light at an exposing step.

As the miniaturization of a semiconductor integrated circuit so advances that the rules for designing circuit elements or wiring lines come to an order of submicrons, there arises a serious problem of a drop of the pattern transfer precision in the photolithography step of transferring an integrated circuit pattern on a photomask to a semiconductor wafer by the action of a light such as the i-line (having a wavelength of 365 nm).

In case, for example, a pattern composed of transparent areas P and opaque areas N on a photomask 30 (including a reticle), as shown in FIG. 34, is to be transferred onto a semiconductor wafer, the individual lights just having passed through the paired transparent areas P and P across one opaque areas N have an identical phase.

Over the semiconductor wafer, therefore, those two lights interfere and intensify each other at their boundary. In case the opaque areas N have a smaller width than the exposure wavelength, the projected pattern image on the semiconductor wafer has its contrast dropped to reduce its focal depth so that its transfer precision is drastically degraded. This problem becomes the more serious for the finer pattern of the semiconductor integrated circuit.

As means for solving such problem, there has been noted a phase shift technology for preventing the drop of the contrast of the projected image by changing the phases of the lights to pass through the mask.

The phase shift technology has been disclosed in Japanese Patent Publication No. 50811/1987 or Japanese Patent Laid-Open No. 67514/1987, No. 140743/1990 or No. 252659/1991, for example.

First of all, Japanese Patent Publication No. 50811/1987 has disclosed a phase shift technology for weakening the optical intensities of two lights over the semiconductor wafer at their boundary by providing a phase shifter of a transparent film in one of a pair of transparent areas across an opaque area on a photomask so that the two lights having passed through the paired transparent areas may have their phases inverted.

In this phase shift exposure technology, when a pattern composed of transparent areas P and P and an opaque area N on a phase shift mask 31, as shown in FIG. 36, is to be transferred onto the semiconductor wafer, either of the paired transparent areas P and P is equipped with a phase shifter 32 of a transparent film having a predetermined refractive index, and the phase shifter 32 has its film thickness adjusted to invert the phases of the two lights just having passed through those transparent areas P and P. As a result, the two lights interfere and weaken each other at their boundary on the semiconductor wafer, as shown in FIG. 37, so that the pattern has its projected image remarkably improved in contrast to have an excellent transfer precision.

On the other hand, Japanese Patent Laid-Open No. 67514/1987 has disclosed a phase shift technology for improving the transfer precision of a pattern by providing second minute transparent areas around the first transparent areas on the phase shift mask and by equipping one of the transparent areas with a phase shifter for inverting the phases of the two lights having passed through the paired transparent areas.

On the other hand, Japanese Patent Laid-Open No. 140743/1990, as made by us, has disclosed a phase shift exposure technology for improving the pattern transfer precision by equipping a portion, e.g., the outer periphery of one transparent area with a phase shifter for emphasizing the edges to invert the phases of the two lights having passed through the portions having the phase shifter and not, so that the pattern transferred may have its contrasts emphasized between its center and periphery.

Furthermore, Japanese Patent Laid-Open No. 252659/1991 has disclosed a phase shift mask for improving the transfer precision of a pattern by arranging a transparent area having a relatively large width at its center in each of a plurality of transparent areas arranged across an opaque area on a mask substrate and by arranging relatively narrower transparent areas, which give their transmitted lights a phase inverted from that of the lights having transmitted through the wider transparent areas, at the two sides of the wider transparent areas.

SUMMARY OF THE INVENTION

However, we have found the following problems in the phase shift exposure technology of the prior art described above.

First of all, the invention disclosed in Japanese Patent Publication No. 50811/1987 is accompanied by the problem that, when the width of the adjoining transparent areas exceeds a predetermined value, the effect of the phase shift exposure cannot be achieved even if the phase shift is arranged in one of the adjoining transparent areas.

On the other hand, the inventions disclosed in Japanese Patent Laid-Open Nos. 67514/1987 and 140743/1990 are of the type for emphasizing the edge portions of the individual patterns and are accompanied by not the aforementioned problem but a problem of determining out how to improve the focal depth of the transfer exposure plane and the resolution of the pattern better as the pattern becomes the more minute.

Moreover, what is disclosed by Japanese Patent Laid-Open No. 252659/1991 is to provide the relatively narrow transparent areas at the two sides of the relatively wide transparent areas. Thus, our trial mask, exposure experiment and simulation of the optical intensity distribution on a sample surface have revealed a problem that the effect of improving the focal depth of the transfer exposure plane and the resolution of the pattern may not always be achieved.

This Laid-Open document has failed to describe the method of making the pattern data of the phase shift mask. Hence, when the pattern layout data of the phase shift mask are to be made after the ranges of the size and pitch of the patterns for determining the aforementioned individual transparent areas have been specified, it is difficult to arrange the pattern of the phase shift mask on a complicated integrated circuit pattern having a complicated arrangement. Thus, there arises a problem that it takes a long time and much work to make the pattern layout data of the phase shift mask.

The present invention has been conceived by noting the above-specified subjects and has an object to provide a phase shift exposure technology capable of improving the focal depth of the transfer exposure plane and the resolution of the pattern.

Another object of the present invention is to provide a phase shift exposure technology capable of designing the pattern of the phase shift mask easily.

The aforementioned and other objects and novel features of the present invention will become apparent from the following description to be made with reference to the accompanying drawings.

A representative of the invention to be disclosed will be briefly summarized in the following.

According to features of the present invention, there is provided an exposing method using, when a plurality of repeating patterns arranged in a repeating manner with a pattern pitch equal to or less than an exposure wavelength are to be transferred to a photoresist film deposited on a predetermined substrate, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another across an opaque pattern may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:

(a) a first enlarging step of making the data of said primary transparent pattern, when the pattern data on said phase shift mask are to be made, by enlarging the width of said repeating patterns on the basis of a process condition and to a predetermined extent in at least the direction of the repeating arrangement but without changing the relative position coordinates of said repeating patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming the phase shift mask having said repeating transparent patterns on said mask substrate, on the basis of the data of said primary transparent pattern and the data of said auxiliary transparent pattern;

(d) an exposure step of transferring said plurality of repeating transparent patterns to the photoresist film on said predetermined substrate by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and (e) a step of correcting the process condition during or before and after the exposure such that the individual effective sizes of said plurality of repeating transparent patterns to be transferred to said photoresist film may be prevented from being made larger than an object size due to said first enlarging step.

According to the features, as specified above, even if the pitch of the plurality of repeating patterns to be transferred to the photoresist film is shorter than the exposure wavelength, the width of the primary transparent pattern is enlarged to increase the quantity of the line to pass through the primary transparent pattern, so that both the phase difference between the transmitted lights of the primary transparent pattern and the auxiliary transparent pattern and the phase difference between the transmitted lights of the primary transparent patterns adjoining each other can be effectively utilized.

Thus, the action of emphasizing the edges of the pattern to be transferred can be improved by inverting the phases of the transmitted lights of the individual repeating transparent patterns between the primary transparent pattern and the auxiliary transparent pattern. At the same time, the action of increasing the intensities of the lights having passed through the adjoining repeating transparent patterns can be improved by inverting the phases of the lights to pass through the adjoining repeating transparent patterns.

Moreover, the data of the primary transparent pattern and the auxiliary transparent pattern are automatically made on the basis of the data of the pattern to be transferred, so that the pattern data of the phase shift mask can be easily designed.

DETAILED DESCRIPTION OF THE INVENTION

The present invention will be described in detail in the following in connection with its embodiments with reference to the accompanying drawings.

Embodiment 1

Figure 1:
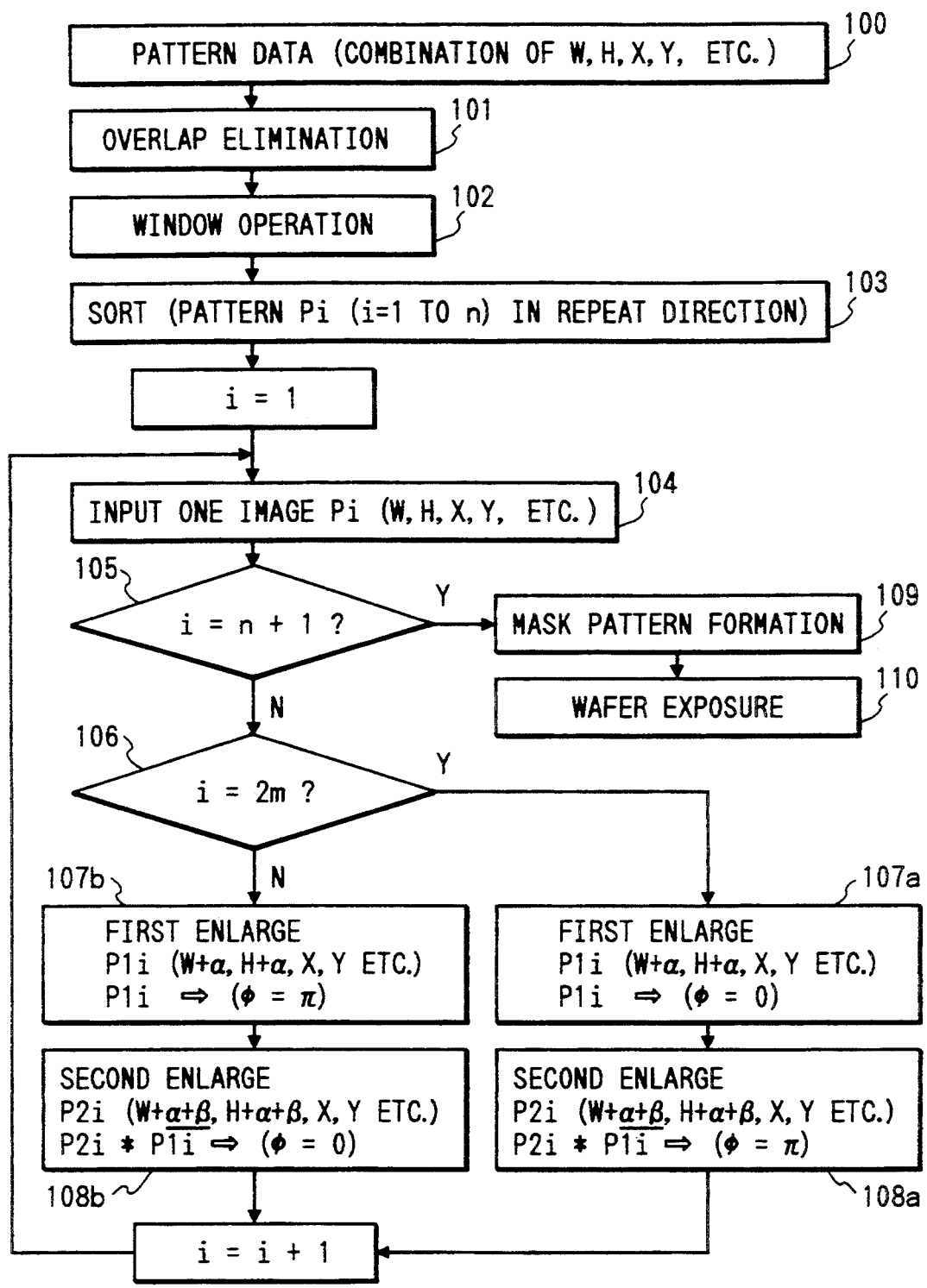
FIG. 1 is a flow chart for explaining a method of making the pattern data of a phase shift mask to be used in an exposing process according to one embodiment of the present invention.
Figure 2:
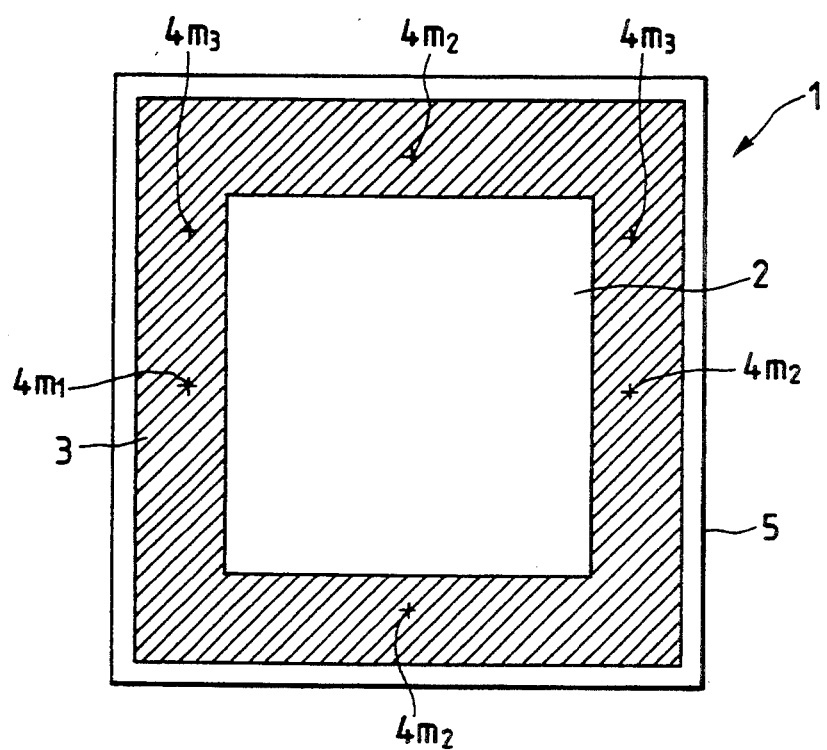
FIG. 2 is a top plan view showing the entirety of the phase shift mask of the present embodiment.
Figure 3:
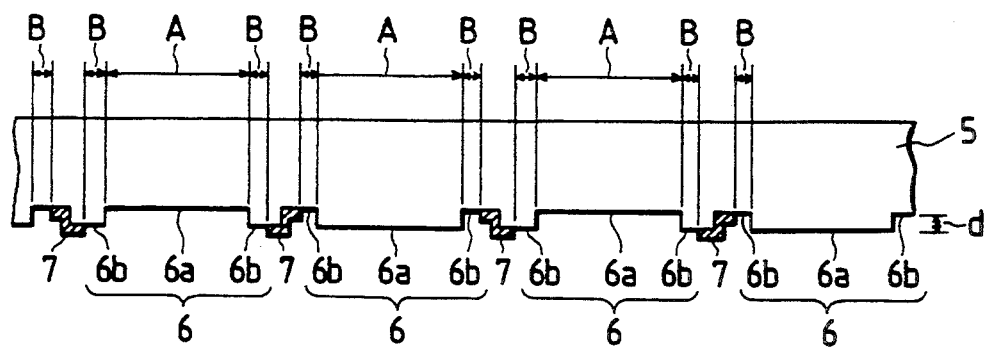
FIG. 3 is a section showing an essential portion of the phase shift mask of FIG. 2.
Figure 4:
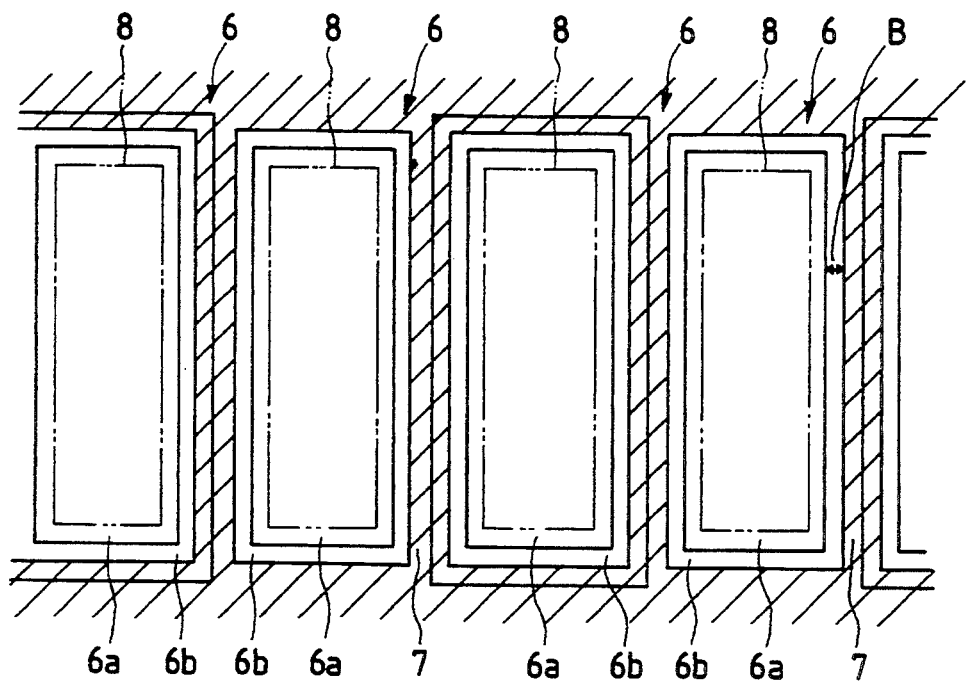
FIG. 4 is a top plan view showing an essential portion of the phase shift mask of FIG. 3.
Figure 5A:
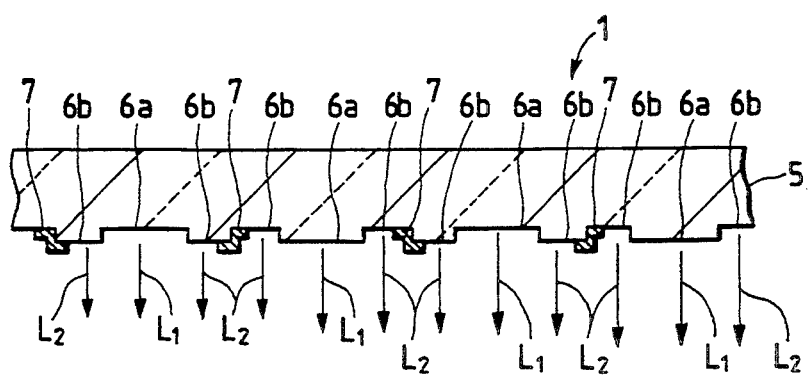
FIGS. 5(a) to 5(c) are diagrams for explaining the amplitude and intensity of a light having passed through the phase shift mask.
Figure 5B:
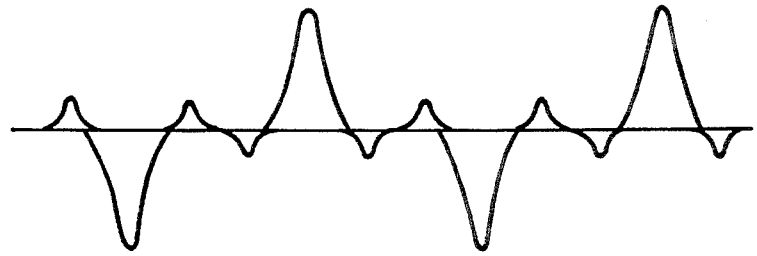
Figure 5C:
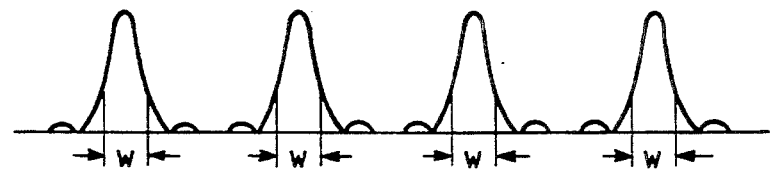
Figure 16:
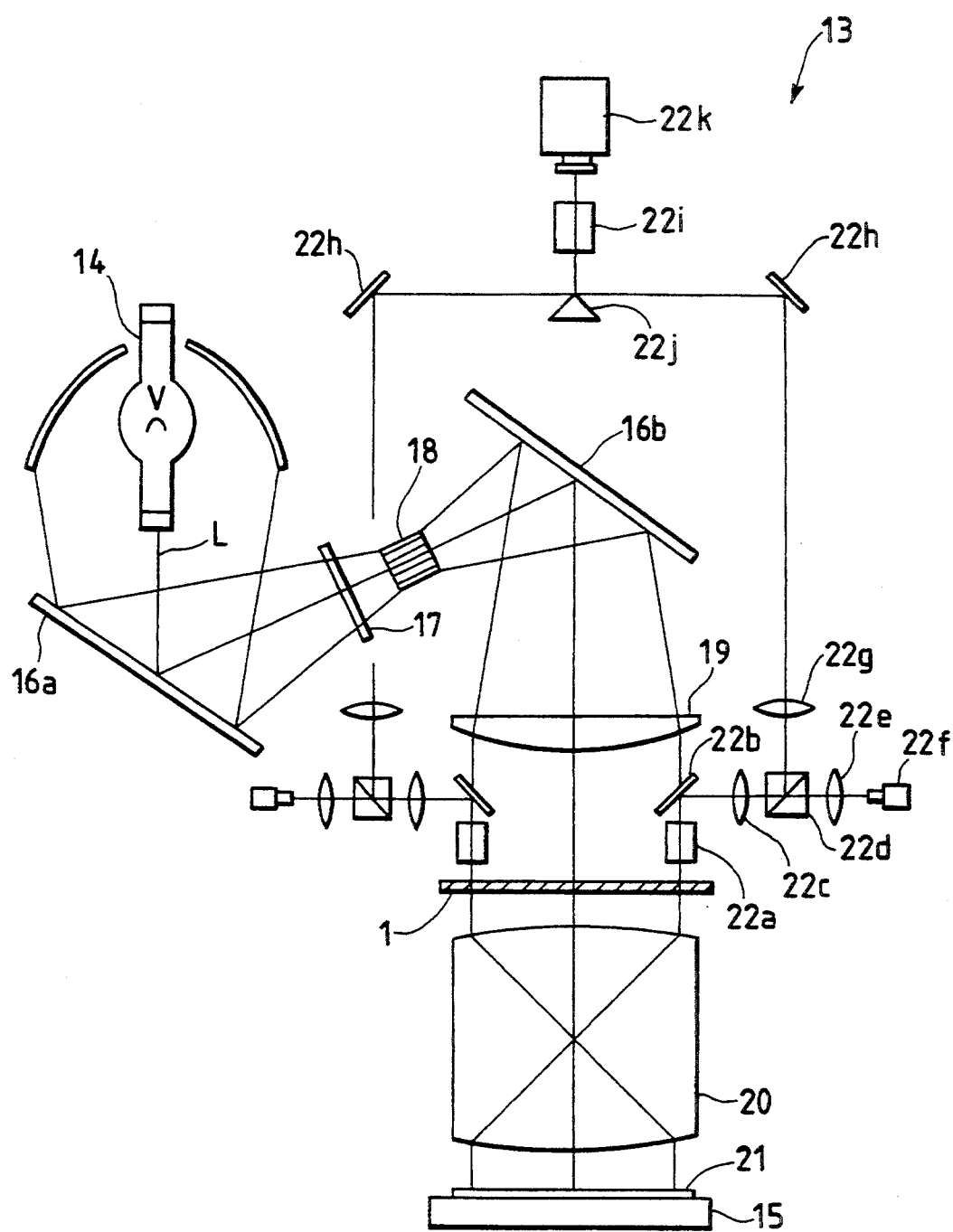
FIG. 16 is a diagram for explaining an exposure apparatus used in the exposing method of the embodiment.
Figure 17:
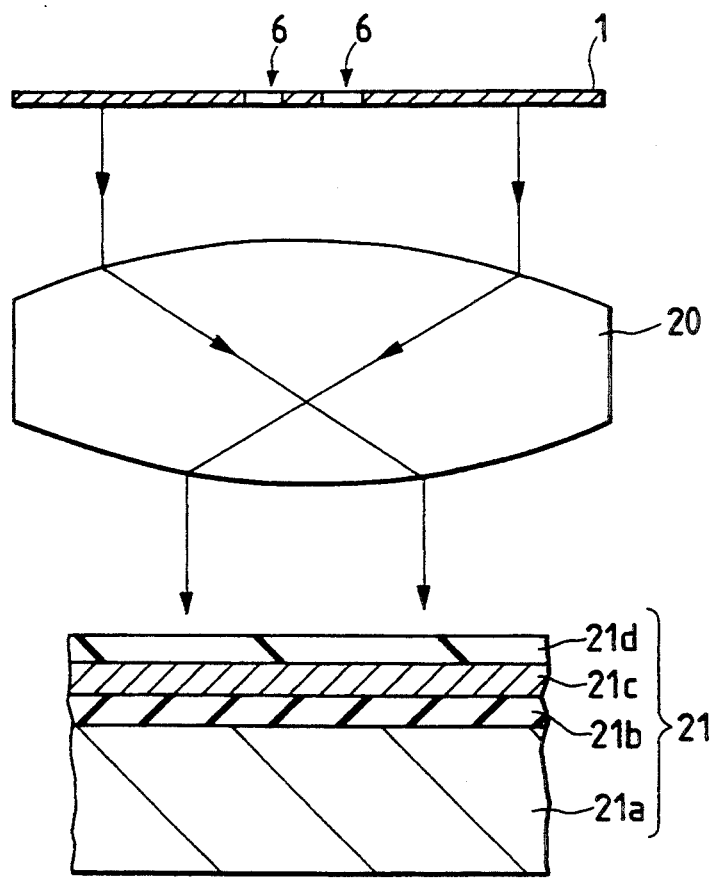
FIG. 17 is a diagram for explaining the exposing method of Embodiment 1.
Figure 18:
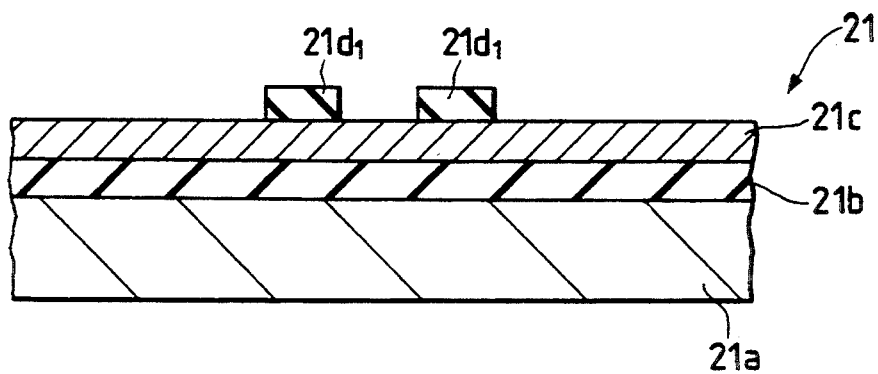
FIG. 18 is a diagram for explaining the exposing method of Embodiment 1.
Figure 19:
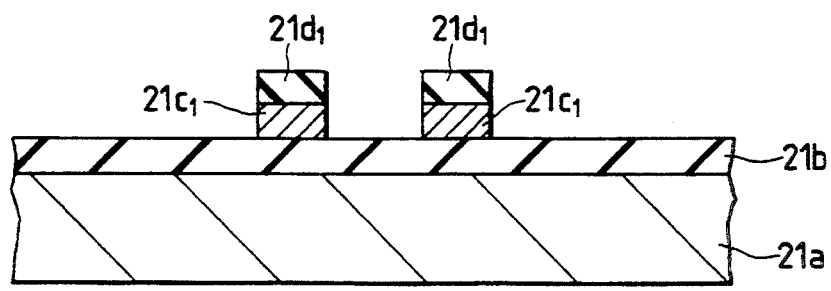
FIG. 19 is a diagram for explaining the exposing method of Embodiment 1.

FIG. 1 is a flow chart for explaining a method of making the pattern data of a phase shift mask to be used in an exposing process according to one embodiment of the present invention; FIG. 2 is a top plan view showing the entirety of the phase shift mask of Embodiment 1; FIG. 3 is a section showing an essential portion of the phase shift mask of FIG. 2: FIG. 4 is a top plan view showing an essential portion of the phase shift mask of FIG. 3; FIGS. 5(a) to 5(c) are diagrams for explaining the amplitude and intensity of a light having passed through the phase shift mask; FIGS. 6(a) and 6(b) to FIGS. 9(a) and 9(b) are graphs for comparing the present invention and the prior art in respect of the optical intensity distributions on a semiconductor wafer; FIGS. 10 to 15 are sections showing an essential portion of a mask substrate at steps of forming the phase shift mask of FIG. 2; FIG. 16 is a diagram for explaining an exposure apparatus used in the exposing method of the present embodiment; and FIGS. 17 to 19 are diagrams for explaining the exposing method of the present embodiment.

A phase shift mask 1 of Embodiment 1, as shown in FIGS. 2 to 4, is a reticle for transferring semiconductor integrated circuit patterns, for example, onto a semiconductor wafer (i.e., a predetermined substrate). The phase shift mask 1 has its principal surface formed with originals of semiconductor integrated circuit patterns having a size of five times, for example, as large as the actual size. Incidentally, primary transparent patterns and secondary transparent patterns formed on the phase shift mask 1, as will be described hereinafter, have their widths used as a conversion size on the semiconductor wafer, unless otherwise specified.

As shown in FIG. 2, the phase shift mask 1 is arranged at its center with a transfer area 2. This transfer area 2 is formed with later-described repeating transparent patterns for transferring the semiconductor integrated circuit patterns.

The transfer area 2 is arranged therearound with an opaque area 3. This opaque area 3 is made of a metal film of chromium (Cr) or the like. The opaque area 3 is formed with a mark $4m_1$ for positioning the phase shift mask 1 and the semiconductor wafer, chip alignment marks $4m_2$, and alignment marks $4m_3$ for the phase shift layer and the opaque layer. These marks $4m_1$ to $4m_3$ are formed of cross-shaped transparent patterns having a size of about 300 μm, for example.

As a result, it is possible to execute the exposure with the phase shift mask 1 and the semiconductor wafer being registered relative to each other, with the phase shift mask 1 and the semiconductor chip on the semiconductor wafer being registered relative to each other, and with the phase shift pattern and the opaque area 3 being registered relative to each other.

A mask substrate 5 constructing the phase shift mask 1 is made of transparent synthetic glass having a refractive index of about 1.47, for example. The mask substrate 5 is arranged on its principal surface across opaque patterns 7 with a plurality of repeating transparent patterns 6 for transferring the semiconductor integrated circuit patterns which repeat at a shorter time interval than the exposure wavelength.

Here, the repeating transparent patterns 6 and 6 adjoining each other has its pitch set to a range no less than one half of the exposure wavelength and no more than the wavelength, for example.

Each repeating transparent pattern 6 is shaped into a rectangular pattern, for example, which is composed of two pattern areas, i.e., a primary transparent pattern 6a arranged at the center thereof and an auxiliary transparent pattern 6b arranged around the primary transparent pattern 6a. Incidentally, double-dotted lines indicate actual repeating patterns 8 to be transferred to the photoresist film.

The primary transparent pattern 6a is a rectangular pattern which is formed by magnifying the actual repeating pattern 8 to be transferred to the photoresist film to a predetermined extent and subsequently by multiplying the reduction ratio of a reducing projection optical system. In Embodiment 1, the primary transparent pattern 6a is so arranged, after being transferred, without any change in position relative to the repeating pattern 8 providing a line-and-space of about 0.3 $\mu$m that its width A is enlarged to about 0.45 $\mu$m/M if the reducing projection optical system has a reduction ratio M, resulting in an enlargement of about 50%.

On the other hand, the auxiliary transparent pattern 6b is a frame-shaped pattern arranged around the primary transparent pattern 6a. The auxiliary transparent pattern 6b has its width B so set that it may not be actually transferred to the photoresist film. Specifically, the width B is set to fall within a range of $0 < B < \lambda/(3M)$, if the exposure wavelength is designated at $\lambda$ and the reduction ratio of the reducing projection optical system is designated at M. In Embodiment 1, the width B is about 0.05 $\mu$m/M, for example.

In Embodiment 1, one repeating transparent pattern 6 has a phase difference of 180 degrees between the light having passed through the primary transparent pattern 6a and the light having passed through the auxiliary transparent pattern 6b. Thus, the pattern transfer precision is improved by the interference between the lights having passed through the primary and auxiliary transparent patterns 6a and 6b.

In the adjoining repeating transparent patterns 6 and 6, moreover, the lights having passed through their individual primary transparent patterns 6a and 6a have a phase difference of 180 degrees. In the adjoining repeating transparent patterns 6 and 6, still moreover, the lights having passed through their individual auxiliary transparent patterns 6b and 6b also have a phase difference of 180 degrees. Thus, the pattern transfer precision is improved by the interference between the lights having passed through the adjoining primary transparent patterns 6a and 6a and the lights having passed through the adjoining auxiliary transparent patterns 6b and 6b.

In Embodiment 1, the means for establishing a phase difference between the transmitted lights is exemplified by grooving the mask substrate to change the thickness of the mask substrate. Here, the depth d can be expressed by $d = \lambda/(2(n-1))$, if the mask substrate 5 has a refractive index n, and has a value of about 390 nm for the wavelength $\lambda$ of 365 nm (of the i-line).

Here, the optical amplitude and intensity are graphically illustrated in FIGS. 5(b) and 5(c) when the light emitted from an exposure light source is projected upon the photoresist film of the semiconductor wafer through the phase shift mask 1.

The lights $L_1$ and $L_1$ just having passed through the adjoining primary transparent patterns 6a and 6a of the phase shift mask 1 of FIG. 5(a) have their phases inverted, as illustrated in FIG. 5(b).

As a result, on the principal surface of the semiconductor wafer, the individual lights $L_1$ and $L_1$ interfere with each other so that they are weakened at the boundary of the adjoining repeating transparent patterns 6 and 6. In the transparent areas of the individual transparent patterns 6a and 6a, on the other hand, the individual lights $L_1$ and $L_1$ interfere with each other and are intensified to form projected diffractive images. These diffractive images are fine lines of high contrast if the lights emitted from the exposure light source are in phase.

On the other hand, the light $L_1$ just having passed through the primary transparent pattern 6a of the phase shift mask 1 of FIG. 5(a) and the light $L_2$ having passed through the auxiliary transparent pattern 6b have phases inverted from each other, as illustrated in FIG. 5(b). As a result, on the principal surface of the semiconductor wafer, the individual lights $L_1$ and $L_2$ interfere each other and are weakened to form the projected diffractive images at the boundaries of the primary and secondary transparent patterns 6a and 6b.

In order to achieve the effects illustrated in FIG. 5, the resolution and focal depth of the projection exposure of the patterns of the phase shift mask 1 have to be increased, as in Embodiment 1, by making the width of the primary transparent pattern 6a more than that of the repeating pattern 8 to be actually transferred, thereby to increase the amount of the light to pass through the primary transparent pattern 6a and by effectively utilizing both the phase difference between the lights having passed through the primary transparent pattern 6a and the auxiliary transparent pattern 6b and the phase differences between the lights having passed through the primary transparent patterns 6a and 6a. These effects are prominent especially in case the minimum line width of the repeating pattern 8 to be transferred to the photoresist film is so small as is less than the exposure wavelength.

Figure 6A:
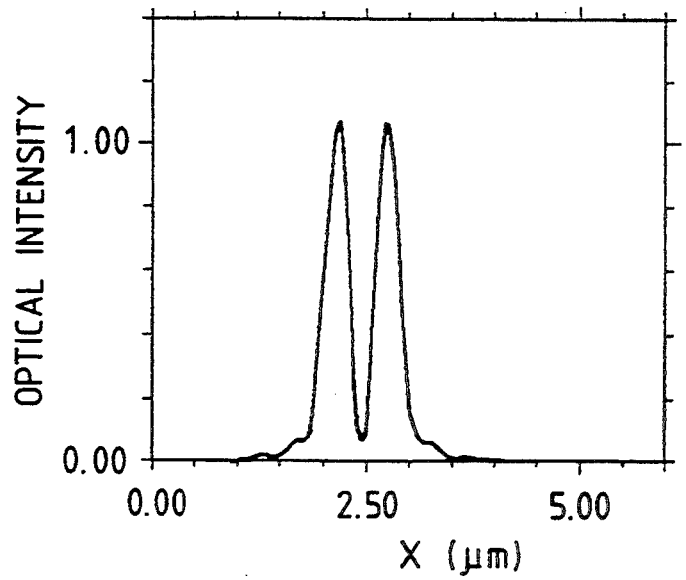
FIGS. 6(a) and 6(b) are graphs for comparing the present invention and the prior art in respect of the optical intensity distribution on a semiconductor wafer.
Figure 6B:
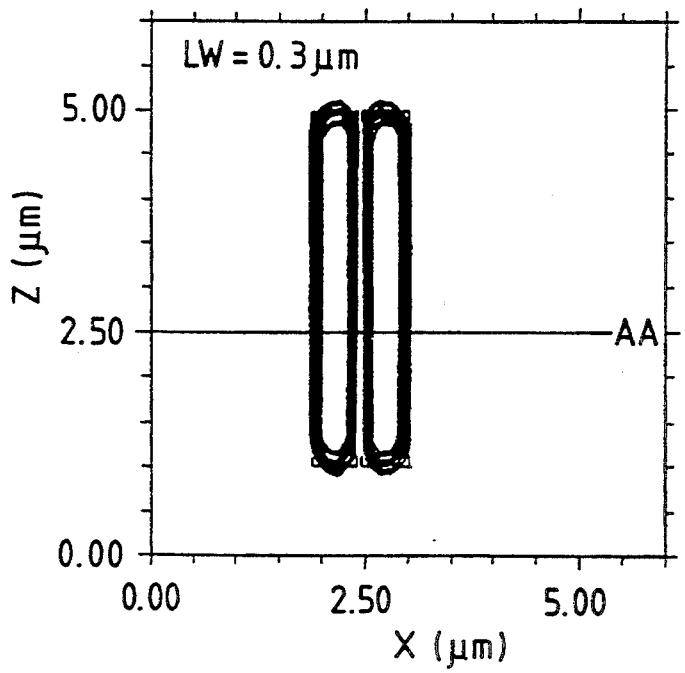

FIGS. 6(a) and 6(b) illustrate the optical intensity distribution which was observed in a defocusing plane at a distance of about 0.5 $\mu$m from the principal surface of the semiconductor wafer, in case the exposure was carried by using the phase shift mask 1 having the aforementioned structure for an exposing light of the i-line, a coherency $\sigma = 0.3$ and a projecting optical lens having an NA = 0.5. An optical intensity curve obtained has an extremely steep gradient.

The resist pattern (i.e., repeating pattern) obtained is composed of two line patterns having a width of 0.3 $\mu$m and a pitch of 0.3 $\mu$m. If, in this case, the reducing projection exposure system has a reduction ratio M, the primary transparent pattern 6a magnified with an unchanged relative position of the actual repeating pattern has a width A of 0.45 $\mu$m/M, resulting in an enlargement of about 50%, and the auxiliary transparent pattern 6b has a width of 0.05 $\mu$m/M.

Figure 7A:
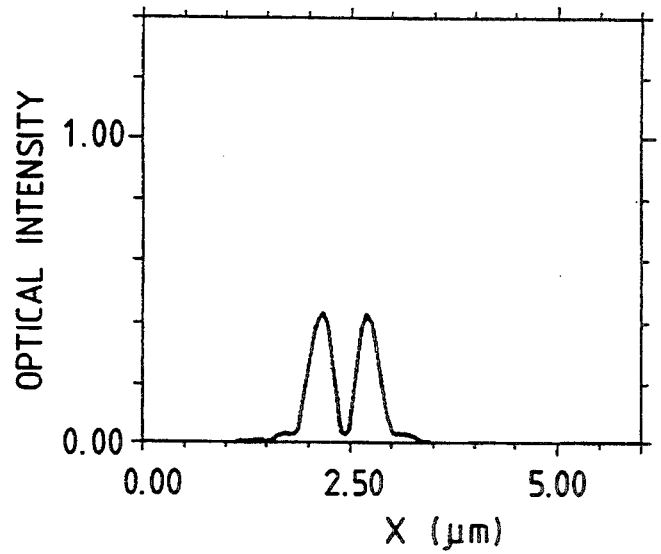
FIGS. 7(a) and 7(b) are graphs for comparing the present invention and the prior art in respect of the optical intensity distribution on a semiconductor wafer.
Figure 7B:
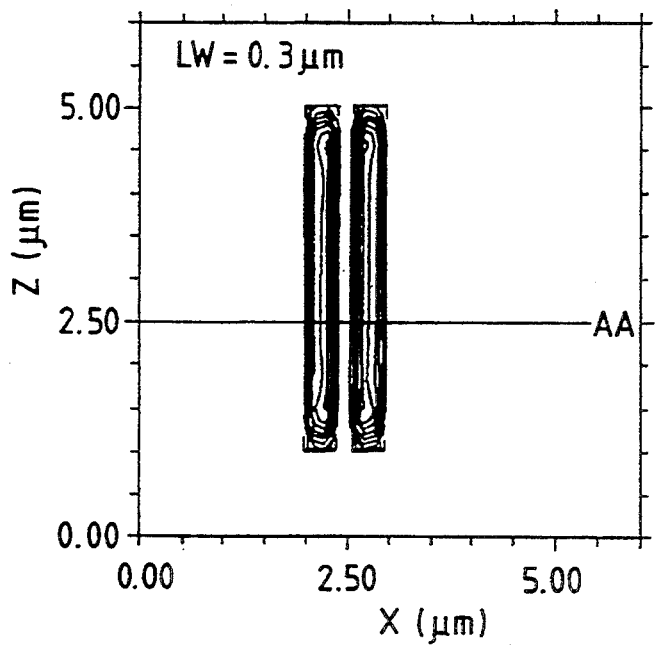

On the other hand, FIGS. 7(a) and 7(b) illustrate the optical intensity distribution under the same condition in case the width A of the principal transparent pattern 6a is not enlarged. Here, if the reduction ratio of the reducing projection exposure is designated at M, the width of the primary transparent pattern of the phase shift mask is exemplified by 0.3 μm/M, and the width of the auxiliary transparent pattern is exemplified by 0.05 μm/M.

In case the width A of the primary transparent pattern 6a is made larger than the width of the repeating pattern 8 to be actually transferred, as in Embodiment 1, it is found by comparing FIGS. 6 and 7 that the optical intensity gradient is steeper than that of the otherwise case of the prior art. As a result, a clearer pattern can be transferred onto the photoresist film on the semiconductor wafer.

Figure 8A:
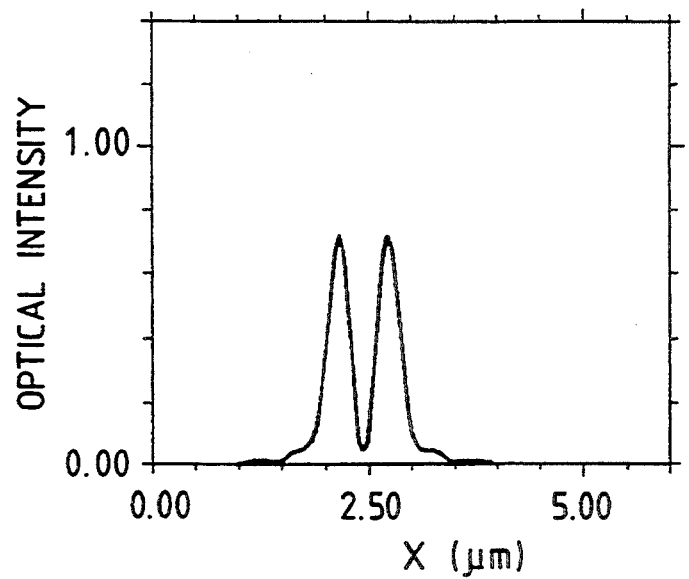
FIGS. 8(a) and 8(b) are graphs for comparing the present invention and the prior art in respect of the optical intensity distribution on a semiconductor wafer.
Figure 8B:
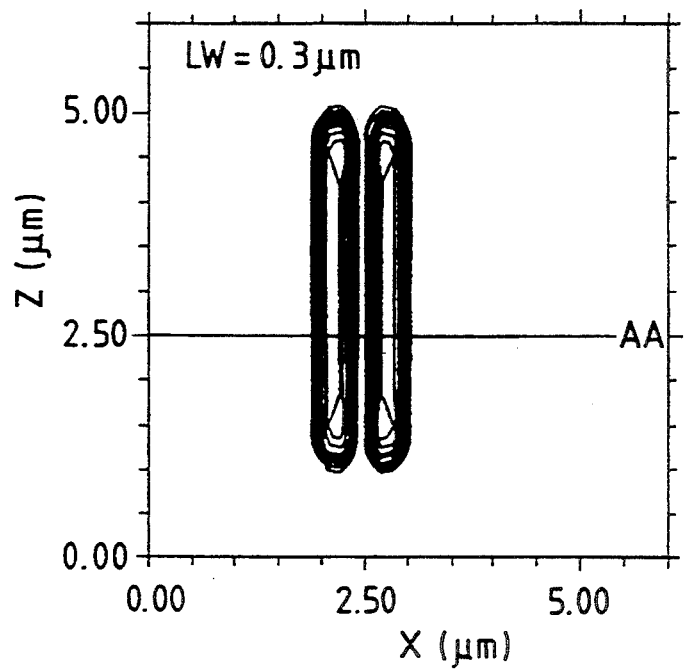

FIGS. 8(a) and 8(b) illustrate the optical intensity distribution under the same condition in case the phase shift mask having no auxiliary transparent pattern is used. Here, if the reduction ratio of the reducing projection exposure is designated at M, the width of the primary transparent pattern of the phase shift mask of this case is exemplified by 0.3 μm/M.

In case the width A of the primary transparent pattern 6a is made larger than the width of the repeating pattern 8 to be actually transferred, as in Embodiment 1, and in case the auxiliary transparent pattern 6b is arranged around the primary transparent pattern 6a, it is found by comparing FIGS. 6 and 8 that the optical intensity gradient is steeper than that of the otherwise case of the prior art. As a result, a clearer pattern can be transferred onto the photoresist film on the semiconductor wafer.

Figure 9A:
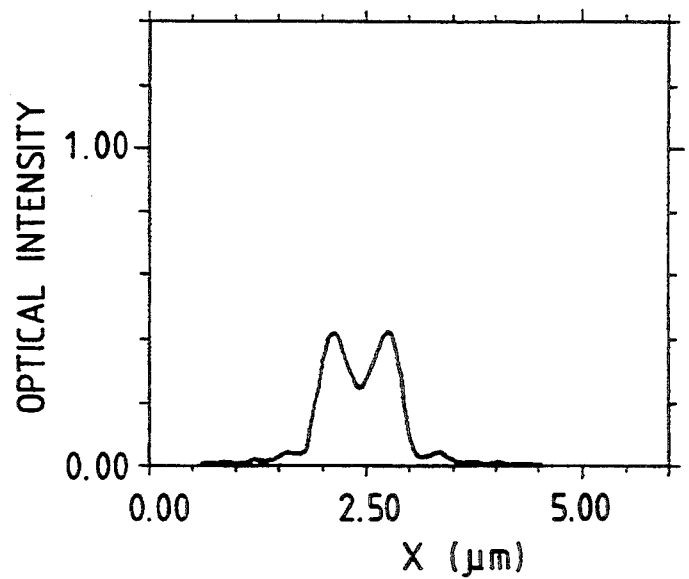
FIGS. 9(a) and 9(b) are graphs for comparing the present invention and the prior art in respect of the optical intensity distribution on a semiconductor wafer.
Figure 9B:
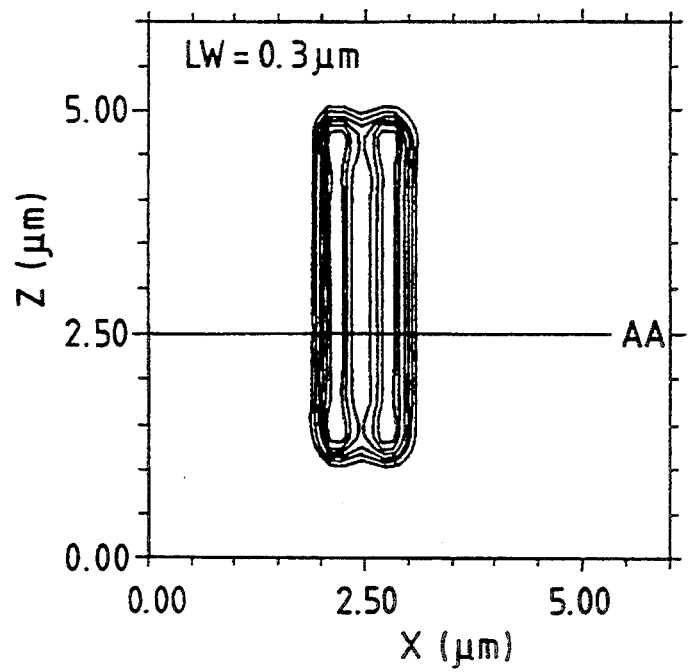

FIGS. 9(a) and 9(b) illustrate the optical intensity distribution under the same condition as that of the case of the photomask of the prior art having no phase shift means. Here, if the reduction ratio of the reducing projection exposure is designated at M, the width of the primary transparent pattern of the photomask is exemplified by 0.3 μm/M. For this photomask, as could be anticipated, it is difficult to resolve the adjoining patterns.

In case the width A of the primary transparent pattern 6a is made larger than the width of the repeating pattern 8 to be actually transferred, as in Embodiment 1, and in case the auxiliary transparent pattern 6b is arranged around the primary transparent pattern 6a, it is found by comparing FIGS. 6 and 9 that the optical intensity gradient is steeper than that of the case of the ordinary photomask. As a result, a clearer pattern can be transferred onto the photoresist film on the semiconductor wafer.

Next, the method of making pattern data in the phase shift mask 1 of Embodiment 1 will be described with reference to FIG. 1.

First of all, the pattern data of a semiconductor integrated circuit device or the like are displayed (at Step 100) in combination of rectangular graphics, for example, with the description of information of the width W, length It and center coordinates (X, Y) of the graphics (or patterns).

Subsequently, if the patterns superposition in the pattern data of the semiconductor integrated circuit device or the like displayed in that combination, the superposition elimination is executed to eliminate the superposing patterns.

This superposition elimination is executed (at Step 101) by using a computer to expand the patterns of the pattern data over a memory map, to effect an OR processing and to divide the superposing patterns in X- and Y-directions.

After this, as to the pattern data, a window is provided in the area of the adjacent repeating pattern so that the processing by the computer is executed while noting only a predetermined number of repeating patterns in the window. However, this window operation is not indispensable (at Step 102).

Next, the pattern data are rearranged in the repeating direction. Here, it is assumed that one to an n-number of data are in the repeating patterns.

Here, one pattern in the window is inputted (at Step 104), and it is then decided (at Step 105) whether or not the inputted pattern is of an (n+1)-th order.

If it is decided at Step 105 that the inputted pattern is not of the (n+1)-th order, it is decided (at Step 106) which of an even or odd order the inputted pattern belongs to.

If the inputted pattern is of an even order, the following procedure is executed.

First of all, the data of the aforementioned primary transparent pattern 6a (as shown in FIG. 4) are made (at the first enlarging Step) by enlarging the inputted pattern without any change in the coordinates of its relative position under the processing conditions of the semiconductor integrated circuit device such as the pattern width, the exposing optical intensity, the resist sensitivity and the development. At this time, a storage is so executed (at Step 107a) that the phase $\phi$ of the light to pass through the primary transparent pattern 6a may be reduced to zero (0).

Subsequently, the data of the primary transparent pattern 6a are wholly enlarged by a predetermined amount $\beta$ under the characteristic conditions of the reducing production exposure optical system such as the exposure wavelength, the reduction rate of the reducing projection exposure device or the characteristics of the projection lens. After this, the data of the aforementioned frame-shaped auxiliary transparent pattern 6b are made (at a second enlarging Step) by eliminating the data of the primary transparent pattern 6a obtained at the first enlarging Step from the resultant pattern data.

At this time, the predetermined amount $\beta$ is limited within a range of $0 < \beta < \lambda/(3M)$. Incidentally, the storage is made such that the phase $\phi$ of the light to pass through the auxiliary transparent pattern 6b takes a value such as $\pi$. In other words, the phase $\phi$ is inverted (at Step 108a) from that of the light to pass through the primary transparent pattern 6a.

After this, the pattern number i is incremented by 1, and the routine is returned to the upstream of the one-image inputting Step 104.

On the other hand, if it is decided at Step 106 that the inputted pattern is of an odd order, the operation itself is similar to that of an even order.

In the first enlarging Step, however, the storage is executed such that the phase $\phi$ of the light to pass through the primary transparent pattern 6a takes the value $\pi$. Specifically, the phase $\phi$ is inverted (at Step 107b) from that of the light to pass through the primary transparent pattern 6a of an even order adjoining the former primary transparent pattern 6a.

At the second enlarging Step, moreover, the storage is made such that the phase $\phi$ of the light to pass through the auxiliary transparent pattern 6b takes a value such as 0. In other words, the phase is inverted (at Step 108b) from that of the light to pass through the primary transparent pattern 6a in the same repeating transparent pattern 6.

The description made above is directed to the case in which the pattern is wholly enlarged at the first enlarging Step. However, the present invention should not be limited thereto but may be modified such that the enlargement of the pattern is changed in the pattern repeating direction and in the direction perpendicular to the former direction. For example, the enlargement in the perpendicular direction is about one half as large as the pattern repeating direction. As a result, the restriction on the pattern arrangement can be coped with.

At the instant when the operations described above are executed upon all the repeating patterns, that is, when the value i of Step 105 takes the value of (n+1), the pattern data making routine is ended.

After this, the patterns are formed on the phase shift mask 1 on the basis of those pattern data, as will be described hereinafter, and exposures are executed (at Steps 109 and 110) by using that phase shift mask 1.

Next, the method of forming the exposure pattern of the phase shift mask 1 in Embodiment 1 on the basis of the pattern data made as above will be described with reference to FIGS. 10 to 15.

Figure 10:
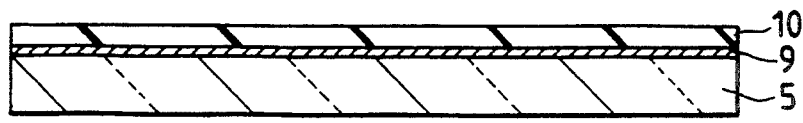
FIG. 10 is a section showing an essential portion of a mask substrate at a step of forming the phase shift mask of FIG. 2.

At first, as shown in FIG. 10, on the principal surface of the transparent mask substrate 5 made of a quartz substrate or the like, there is deposited a metal thin film 9 of Cr or the like by the sputtering method. On this metal thin film 9, there is then deposited an electron beam resist film 10 by the spinning application method.

Subsequently, the mask substrate 5 is irradiated with an electron beam by using an electron-beam drawing apparatus. This electron-beam drawing apparatus is controlled by a computer to scan the electron beam on the basis of the pattern data such as the graphic information of the semiconductor integrated circuit patterns including the pattern data of the aforementioned phase shift mask 1 or the information of the positional coordinates. The pattern data used here correspond to the area ($\phi = \pi$) in which the phase of the transmitted light, as shown in FIG. 1, is inverted.

The peripheral portion of the mask substrate is exposed to the alignment marks $4m_3$ between the phase shift layer and the opaque layer, as shown in FIG. 2, in addition to the aforementioned pattern. The marks $4m_3$ are formed of cross-shaped transparent patterns, for example.

After this, the exposed or unexposed portions are removed by a developing liquid to form resist patterns (although not shown) in accordance with the positive or negative type of the electron-beam resist film 10. After this, the metal thin film 9 exposed to the resist pattern is etched off by using that resist patterns as an etching mask.

This metal thin film 9 can be etched off by a wet method using ammonium cerium nitrate.

Next, the mask substrate 5 is etched with an oxygen plasma to remove the resist patterns and is then cleaned.

Subsequently, the mask substrate 5 may desirably have its appearance inspected. If this appearance inspection finds a minute defect left in the metal thin film 9, the remaining portion is removed by irradiating it with a laser beam.

Figure 11:
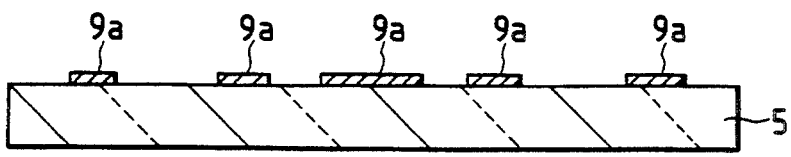
FIG. 11 is a section showing an essential portion of a mask substrate at a step of forming the phase shift mask of FIG. 2.

Moreover, if a cutout defect is found in the metal thin film 9, its portion is subjected to a spot exposure by using a negative photoresist film and is developed to leave the photoresist film thereon. Thus, metal thin film patterns 9a for forming the phase shift layer are formed effectively in no-defect state on the mask substrate 5, as shown in FIG. 11.

Figure 12:
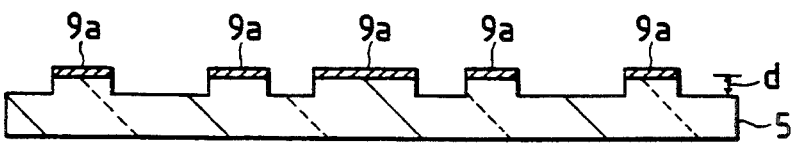
FIG. 12 is a section showing an essential portion of a mask substrate at a step of forming the phase shift mask of FIG. 2.

After this, as shown in FIG. 12, the metal thin film patterns 9a on the mask substrate 5 are used as the etching mask to etch off the mask substrate portions exposed from the metal thin film patterns 9a, by the predetermined depth d by the plasma etching method using $CF_4$ so that the mask substrate 5 is formed with corrugations having the depth d for shifting the phase of the transmitted light.

Here, the depth d of the mask substrate 5 may be set to satisfy either the equation of $d=\lambda/(2(n-1))$, if the mask substrate 5 has the refractive index n or a relation of odd times of the equation.

For the light wavelength of 365 nm (of the i-line) and the refractive index of 1.47 of the mask substrate 5, for example, the depth d of the mask substrate 5 may be set to about 390 nm. By the plasma etching of $CF_4$, the depth can be controlled depending upon the etching time period.

Incidentally, if a predetermined portion of the mask substrate 5 fails to have the predetermined depth, the defective portion may be irradiated with a convergent ion beam, for example, so that it may be etched off to have the predetermined depth.

In order to form the aforementioned phase shift means, the method of depositing a transparent film and an opaque film of predetermined thicknesses on the mask substrate 5 can be adopted to improve the working precision of the depth d in place of the aforementioned method of forming the grooves in the mask substrate 5.

Figure 13:
FIG. 13 is a section showing an essential portion of a mask substrate at a step of forming the phase shift mask of FIG. 2.

Next, the metal thin film patterns 9 are removed by the same wet etching treatment as the aforementioned one, to form the mask substrate 5 having the phase shifting corrugations on the principal surface, as shown in FIG. 13.

Figure 14:
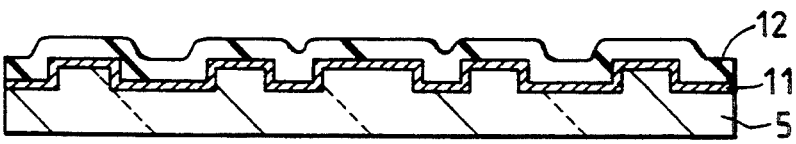
FIG. 14 is a section showing an essential portion of a mask substrate at a step of forming the phase shift mask of FIG. 2.
Figure 15:
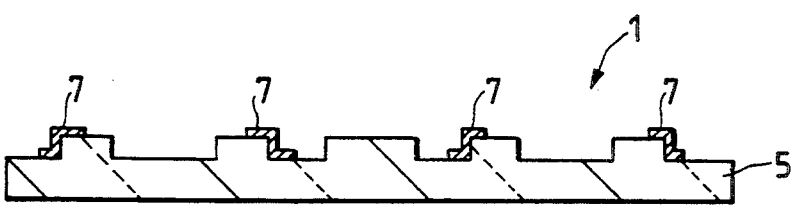
FIG. 15 is a section showing an essential portion of a mask substrate at a step of forming the phase shift mask of FIG. 2.

Subsequently, as shown in FIG. 14, a metal thin film 11 of Cr or the like is deposited on the principal surface of the mask substrate 5 by the sputtering method, for example. After this, an electron-beam resist film 12 is deposited on the metal thin film 11 by the spinning application or the like.

After this, the positions of the aforementioned positioning marks $4m_3$ are located by using the electron-beam graphic apparatus to align the coordinate system of the corrugation patterns formed on the mask substrate 5. Then, the electron-beam resist film 12 on the mask substrate 5 is irradiated with an electron beam on the basis of the pattern data of the aforementioned phase shift mask 1 so that a desired pattern is transferred onto the electron-beam resist film 12.

Here, the patterns to be irradiated with the electron beam form the opaque area, namely, the positive-negative reversed area of the transparent area (i.e., the composed area of $\phi = \pi$ and $\phi = 0$) shown in FIG. 1. Since the pattern superposition can be no more than 0.1 $\mu$m in respect of the drawing precision of the electron-beam graphic apparatus, this method can be applied to the reticle of the exposure apparatus having a reduction ratio of 1/5.

Next, the opaque area 3 (as shown in FIG. 2) of The mask substrate 5 is exposed to, in addition to the aforementioned patterns, the pattern of the mark $4m_1$ for aligning the phase shift mask 1 and the semiconductor wafer. This pattern of the mark $4m_1$ is assigned by the reducing projection exposure apparatus.

Subsequently, the electron-beam resist film 12 has its exposed or unexposed portion removed in dependence upon its positive or negative type by a developing liquid, to form the resist patterns. After this, the metal thin film 11 exposed from the resist patterns is etched off.

Finally, these resist patterns are removed, and the opaque patterns 7 are formed on the mask substrate 5 until their appearances are inspected.

If, at this time, a minute left defect is found in the metal thin film 11 shown in FIG. 14, the remaining portion is removed by irradiating it with a laser beam, for example.

If a cutout defect is found in the metal thin film 11 shown in FIG. 14, the phase shift mask 1 is put into a treating chamber fed with an organic gas. After this, the defective portion is irradiated with a convergent ion beam to form an opaque film such as a carbon film in the defective portion thereby to correct the defect.

Next, an example of the reducing projection exposure apparatus to be used in the exposing method of Embodiment 1 will be described in the following with reference to FIG. 16. A reducing projection exposure apparatus 13 of Embodiment 1 has a coherency $\sigma=0.3$, for example, and its projecting optical lens has an NA=0.5, for example. The reducing projection exposure has a reduction ratio M of 1/5, for example.

The reducing projection exposure apparatus 13 has its optical system arranged on an optical path joining an exposure light source 14 and a sample stage 15 and composed of mirrors 16a and 16b, a shutter 17, a flyeye lens 18, a condenser lens 19 and a reducing projection optical lens system 20.

The aforementioned phase shift mask 1 is set and positioned between the condenser lens 19 and the reducing projection optical lens system 20 of the reducing projection exposure apparatus 13 by an alignment optical system 22 for positioning the phase shift mask 1 and the semiconductor wafer 21.

The alignment optical system 22 is composed of condenser lenses 22a, 22c, 22e, 22g, 22i and 22j, half mirrors 22b and 22d, a positioning light source 22f, a monitor camera 22k and a mirror 22h.

The exposure light source 14 is exemplified by a high-voltage mercury lamp for emitting a light L such as the i-line. The semiconductor wafer 21 placed on the sample stage 15 is made of a single crystal of silicon (Si) and has its principal surface applied with a photosensitive photoresist film by the spinning method.

The light L emitted from the exposure light source 14 of the reducing projection exposure apparatus 13 is made incident upon the principal surface of the semiconductor wafer 21 through the mirror 16a, the condenser lens 19, the phase shift mask 1 and the reducing projection optical lens system 20.

Next, the exposing method and patterning method of Embodiment 1 will be described with reference to FIGS. 17 to 19.

First of all, a metal film 21c of aluminum (Al or the like) is deposited by the sputtering method on an insulating film 21b which is made of $SiO_2$ or the like and formed on a semiconductor substrate 21a forming the semiconductor wafer 21. After this, a photoresist film 21d having a thickness of about 0.6 μm is deposited on that metal film 21c.

Subsequently, the semiconductor wafer 21 is subjected to a baking treatment. In Embodiment 1, the baking temperature is set to a lower level than the pre-exposure baking temperature used in the phase shift mask of the prior art, in which the repeating transparent pattern is not enlarged, so that the repeating pattern to be transferred to the photoresist film 21d may not have its effective size enlarged.

After this, the phase shift mask 1 and the semiconductor wafer 21 are arranged in the predetermined positions of the reducing projection exposure apparatus 13 (as shown in FIG. 16). Then, the semiconductor wafer 21 is irradiated with the light emitted from the exposure light source 14, as shown in FIG. 17, through the phase shift mask 1. At this time, in Embodiment 1, the exposure time period is shortened more than that for using the phase shift mask of the prior art, in which the size of the repeating transparent pattern 6 is not enlarged, so that the effective size of the repeating pattern to be transferred to the photoresist film 21d may not be enlarged.

Next, the semiconductor wafer 21 is subjected to the baking treatment. At this time, too, in Embodiment 1, the baking temperature is also lowered more than that for using the phase shift mask of the prior art, in which the size of the repeating transparent pattern 6 is not enlarged, so that the effective size of the repeating pattern to be transferred to the photoresist film 21d may not be enlarged.

Subsequently, the photoresist film 21d on the semiconductor wafer 21 is subjected to a development to form resist patterns $21d_1$, as shown in FIG. 18.

At this time, in Embodiment 1, the developing time period is shortened by lowering the solubility of the developing liquid, for example, more than that for using the phase shift mask of the prior art, in which the size of the repeating transparent pattern 6 is not enlarged, so that the effective size of the repeating pattern to be transferred to the photoresist film 21d may not be enlarged.

After this, the metal film 21c exposed from the resist patterns $21d_1$ is etched off by using the resist patterns $21d_1$ as the etching mask, to form the wiring patterns (or repeating patterns) $21c_1$ on the semiconductor wafer 21, as shown in FIG. 19.

Thus, the following effects can be achieved according to Embodiment 1.

(1) The phases of the lights to pass through the individual repeating transparent patterns 6 are opposed in their primary transparent patterns 6a and auxiliary transparent patterns 6b to emphasize the edges of the patterns to be transferred, and the phases of the lights to pass through the adjoining primary transparent patterns 6a and 6a are also opposed to intensity the lights having passed through the two primary transparent patterns 6a and 6a, so that the focal depth of the transfer exposure plane can be increased while improving the resolutions of the patterns to be transferred.

(2) Thanks to the aforementioned effect (1), fine patterns can be formed in high precision to improve the reliability and yield of the semiconductor integrated circuit device having fine patterns.

(3) On the basis of the pattern data of the semiconductor integrated circuit device to be transferred, the data of the primary transparent patterns 6a and the data of the auxiliary transparent patterns 6b can be automatically made to design the pattern data of the phase shift mask 1 easily. In other words, it is possible to facilitate the designing of the pattern data of the phase shift mask 1 for transferring the semiconductor integrated circuit pattern having a complex arrangement.

Embodiment 2

Figure 20:
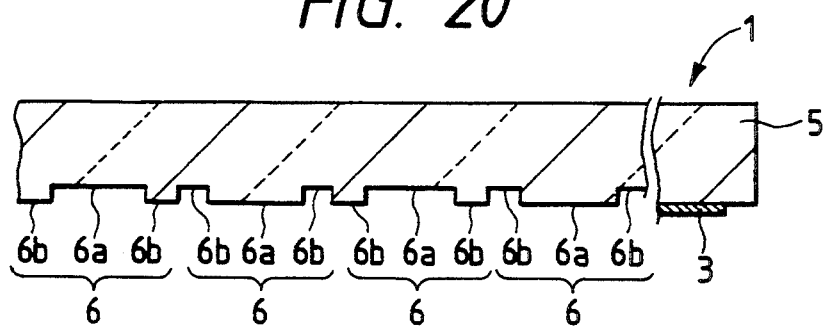
FIG. 20 is a section showing an essential portion of a phase shift mask to be used in an exposing method according to another embodiment of the present invention.
Figure 21:
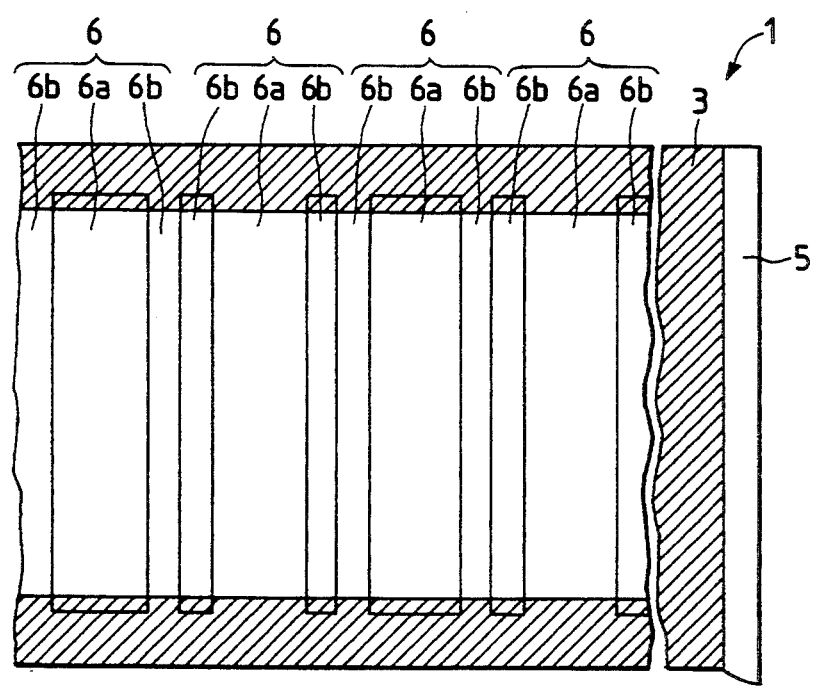
FIG. 21 is a top plan view showing an essential portion of the phase shift mask of FIG. 20.
Figure 22A:
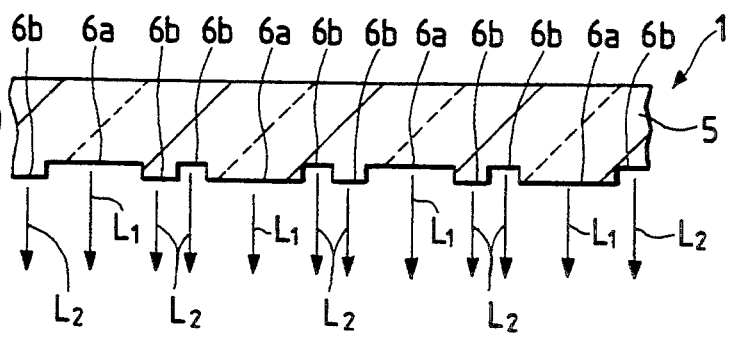
FIGS. 22(a) to 22(c) are diagrams for explaining the amplitude and intensity of a light having passed through the phase shift mask of FIG. 20.
Figure 22B:
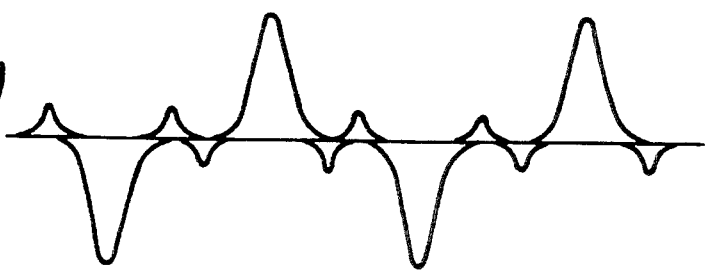
Figure 22C:
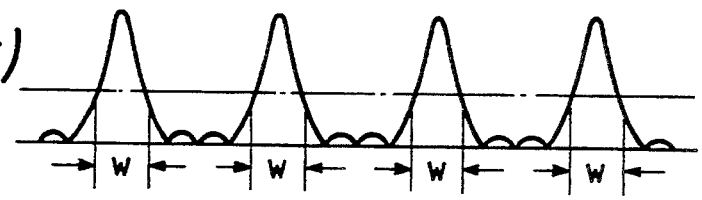

FIG. 20 is a section showing an essential portion of a phase shift mask to be used in an exposing method according to another embodiment of the present invention; FIG. 21 is a top plan view showing an essential portion of the phase shift mask of FIG. 20; and FIGS. 22(a) to 22(c) are diagrams for explaining the amplitude and intensity of a light having passed through the phase shift mask.

In Embodiment 2, the repeating patterns are transferred to the photoresist film on the semiconductor wafer merely by controlling the phases of the lights having passed through the phase shift mask. FIGS. 20 and 21 are a section and a top plan view of the phase shift mask 1 of Embodiment 2, respectively.

The opaque area 3 formed on the mask substrate 5 is formed with rectangular transparent areas. Moreover, these transparent regions are formed therein with the plurality of repeating transparent patterns 6. These repeating transparent patterns 6 have a pitch no less than about one half and no more than of the exposure wavelength as in Embodiment 1.

Each of the repeating transparent patterns 6 is composed like Embodiment 1 of the primary transparent pattern 6a and the auxiliary transparent pattern 6b. The phases of the transmitted lights are similar to those of Embodiment 1. The primary transparent patterns 6a are formed into a rectangular shape. On the other hand, the auxiliary transparent patterns 6b are arranged at the two sides of each primary transparent pattern 6a. The auxiliary transparent patterns 6b are set to have a width W within a range of $0 < W < X\lambda/(3M)$ as in Embodiment 1.

In Embodiment 2, on the contrary, the opaque patterns 7 (as shown in FIGS. 3 and 4) described in Embodiment 1 are not Interposed between the adjoining repeating transparent patterns 6 and 6. This is because patterns for separating the adjoining repeating patterns 6 and 6 can be formed by controlling the phases of the transmitted lights.

In Embodiment 2, too, the opaque area 3 (as shown in FIG. 2) on the mask substrate 5 is made of a metal film of chromium (Cr) or the like. The opaque area 3 is formed with a mark $4m_1$ for positioning the phase shift mask 1 and the semiconductor wafer, chip alignment marks $4m_2$, and alignment marks $4m_3$ for positioning the phase shift layer and the opaque layer. These marks $4m_1$ to $4m_3$ are formed of cross-shaped transparent patterns having a size of about 300 μm, for example.

As a result, it is possible to execute the exposure with the phase shift mask 1 and the semiconductor wafer being registered relative to each other, with the phase shift mask 1 and the semiconductor chip on the semiconductor wafer being registered relative to each other, and with the phase shift pattern and the opaque area 3 being registered relative to each other.

Here, the optical amplitude and intensity will be described with reference to FIG. 22 when the light emitted from an exposure light source is projected upon the photoresist film of the semiconductor wafer through the phase shift mask 1 of Embodiment 2.

The lights $L_1$ and $L_1$ just having passed through the adjoining primary transparent patterns 6a and 6a of the phase shift mask 1 of FIG. 22(a) have their phases inverted, as illustrated in FIG. 22(b).

As a result, on the principal surface of the semiconductor wafer, the individual lights $L_1$ and $L_2$ interfere with each other so that they are weakened at the boundary of the adjoining repeating transparent patterns 6 and 6. In the transparent areas of the individual transparent patterns 6a and 6a, on the other hand, the individual lights $L_1$ and $L_1$ interfere with each other and are intensified to form projected diffractive images. These diffractive images are fine lines of high contrast if the lights emitted from the exposure light source are in phase.

On the other hand, the light $L_1$ just having passed through the primary transparent pattern 6a of the phase shift mask 1 of FIG. 22(a) and the light $L_2$ having passed through the auxiliary transparent pattern 6b have phases inverted from each other, as illustrated in FIG. 22(b). As a result, on the principal surface of the semiconductor wafer, the individual lights $L_1$ and $L_2$ interfere each other and are weakened to form the projected diffractive images at the boundaries of the primary and secondary transparent patterns 6a and 6b. Incidentally, the phase difference of the transmitted lights is exemplified by 180 degrees as in Embodiment 1.

The method of making the pattern data on the phase shift mask 1 of Embodiment 1 is basically similar to that described in connection with Embodiment 1. In case of Embodiment 2, however, at the aforementioned second enlarging Step, the patterns are enlarged only in the direction in which the adjoining repeating patterns 8 are arranged.

Moreover, the method of forming the patterns on the phase shift mask 1 is also basically similar to that of Embodiment 1. In case of Embodiment 2, however, the opaque patterns 7 (as shown in FIGS. 3 and 4) are not formed between the adjoining repeating transparent patterns 6 and 6.

Thus, similar effects to those of Embodiment 1 can also be achieved according to Embodiment 2. In short, the focal depth of the transfer exposure plane can be increased while improving the resolution of the patterns to be transferred.

On the basis of the pattern data of the semiconductor integrated circuit device to be transferred, moreover, the data of the primary transparent pattern 6a and the data of the auxiliary transparent pattern 6b are automatically made so that the pattern data of the phase shift mask 1 for forming the patterns by using only the phase difference of the transmitted lights can be easily designed.

Embodiment 3

Figure 23:
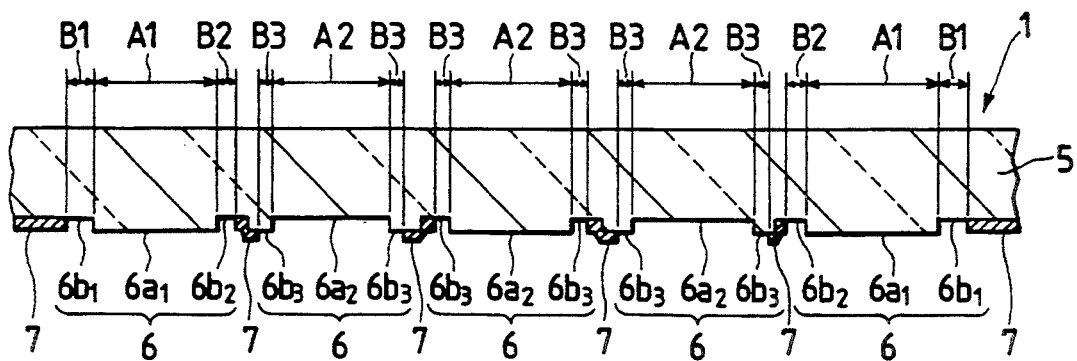
FIG. 23 is a section showing an essential portion of a phase shift mask to be used in an exposing method according to another embodiment of the present invention.
Figure 24:
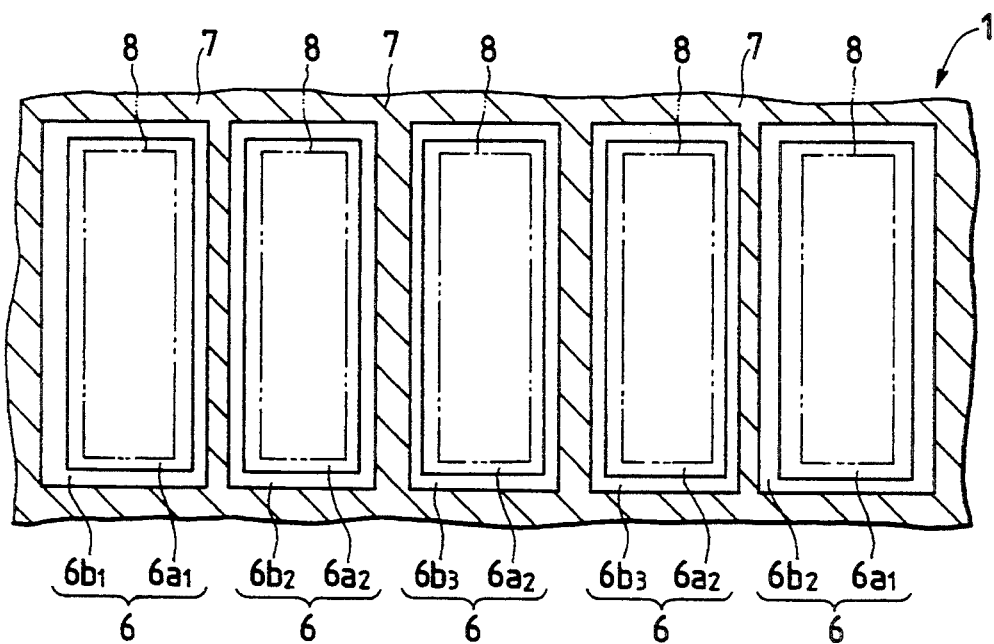
FIG. 24 is a top plan view showing an essential portion of the phase shift mask of FIG. 23.

FIG. 23 is a section showing an essential portion of a phase shift mask to be used in an exposing method according to another embodiment of the present invention, and FIG. 24 is a top plan view showing an essential portion of the phase shift mask of FIG. 23.

In Embodiment 3, as shown in FIGS. 23 and 24, primary transparent patterns $6a_1$ and $6a_2$ have different widths $A_1$ and $A_2$, and auxiliary transparent patterns $6b_1$ and $6b_2$ have different widths $B_1$ to $B_3$.

The width $A_1$ is exemplified by about 2.4 to 2.5 μm. The width $A_2$ is exemplified by about 2.25 μm. The width $B_1$ is exemplified by about 0.35 μm. The width $B_2$ is exemplified by about 0.3 μm. The width $B_3$ is exemplified by about 0.25 μm. Here, the width of the actual repeating patterns to be transferred to the photoresist film is about 0.3 μm.

Figure 37:
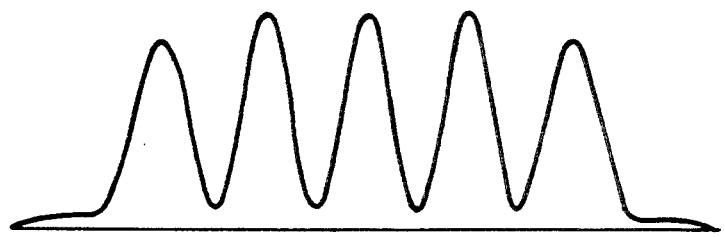
FIG. 37 is a graph plotting the intensity of a light having passed through the phase shift mask of FIG. 36.

These numerical values are determined as shown in FIG. 37, because the sizes of the patterns to be transferred to the photoresist film are intended to be prevented from becoming different between the outer periphery and the center of the semiconductor wafer due to the fact that the optical intensity of the outer periphery of the semiconductor wafer is attenuated more than that of the center.

In other words, the individual widths $A_1$ and $A_2$ of the primary transparent patterns $6a_1$ and $6a_2$ and the individual widths $B_1$ to $B_3$ of the auxiliary transparent patterns $6b_1$ to $6b_3$ are made different to adjust the quantities of the individual lights to pass through the primary transparent patterns $6a_1$ and $6a_2$ and the auxiliary transparent patterns $6b_1$ to $6b_3$ thereby to uniform the optical intensities in the semiconductor wafer plane.

As a result, in case the phase shift mask 1 of Embodiment 3 is used, the plurality of repeating patterns of an identical size can be transferred highly precisely onto the photoresist film on the semiconductor wafer.

Incidentally, the coordinates of the relative positions of the repeating transparent patterns 6 are unchanged. Moreover, the pitch of the repeating transparent patterns 6 is equal to that of Embodiment 1 and is set within a range no less than one half and no more than the exposure wavelength, for example.

Thus, according to Embodiment 3, the following effects can be achieved in addition to those obtained in Embodiments 1 and 2.

Thus, the individual widths $A_1$ and $A_2$ of the primary transparent patterns $6a_1$ and $6a_2$ and the individual widths $B_1$ to $B_2$ of the auxiliary transparent patterns $6b_1$ to $6b_3$ are made different so that the optical intensities in the semiconductor wafer plane can be uniformed by adjusting the quantities of the individual lights to pass through the primary transparent patterns $6a_1$ and $6a_2$ and the auxiliary transparent patterns $6b_1$ to $6b_3$. As a result, the plurality of repeating patterns of an identical size can be transferred to the photoresist film on the semiconductor wafer.

Embodiment 4

Figure 25:
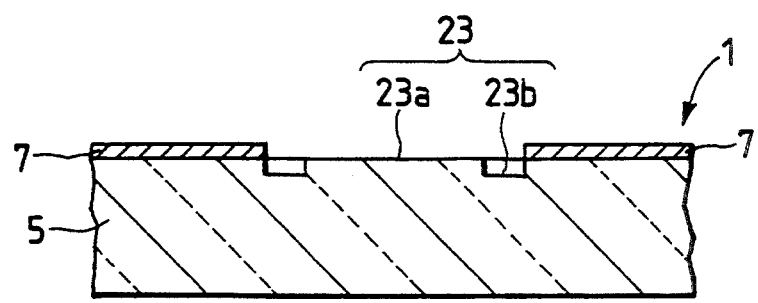
FIG. 25 is a section showing an essential portion of a phase shift mask to be used in an exposing method according to another embodiment of the present invention.
Figure 26:
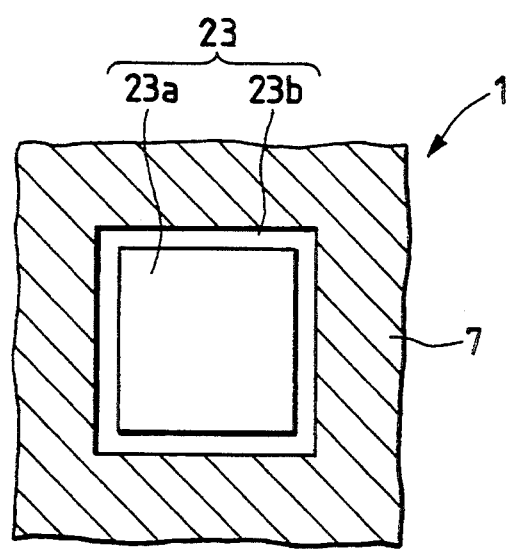
FIG. 26 is a top plan view showing an essential portion of the phase shift mask of FIG. 25.
Figure 27:
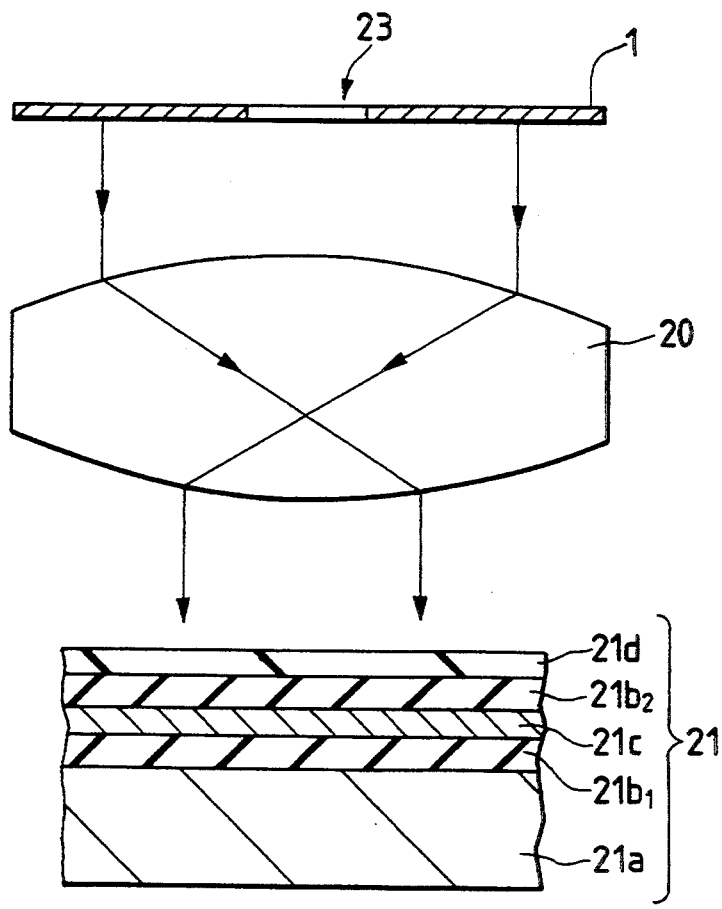
FIG. 27 is a diagram for explaining the exposing method of the present embodiment.
Figure 28:
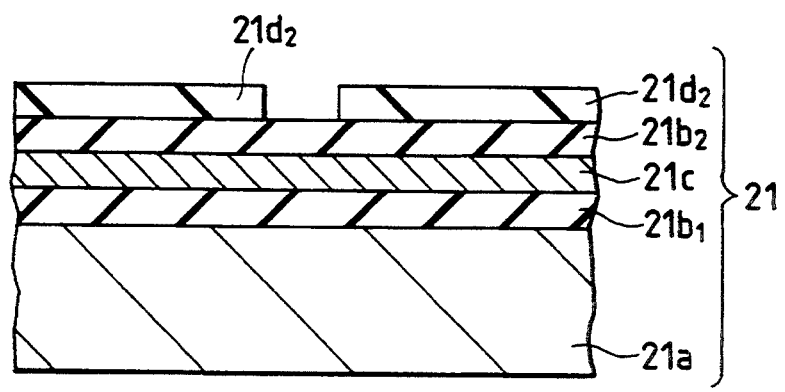
FIG. 28 is a diagram for explaining the exposing method of the present embodiment.
Figure 29:
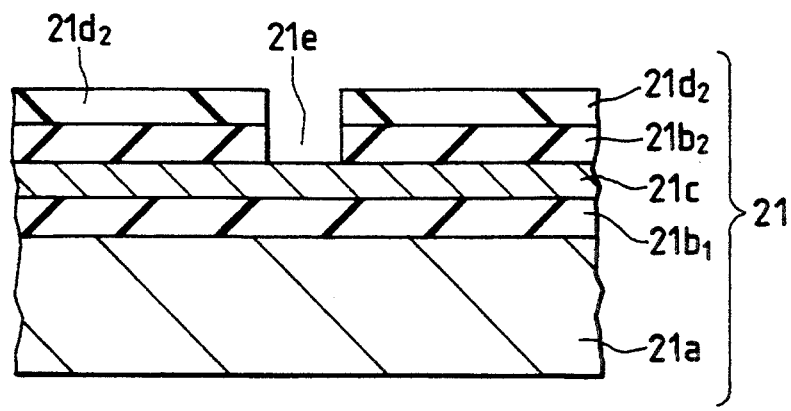
FIG. 29 is a diagram for explaining the exposing method of the present embodiment.

FIG. 25 is a section showing an essential portion of a phase shift mask to be used in an exposing method according to another embodiment of the present invention; FIG. 26 is a top plan view showing an essential portion of the phase shift mask of FIG. 25; and FIGS. 27 to 29 are diagrams for explaining the exposing method of Embodiment 4.

In the phase shift mask 1 of Embodiment 4, as shown in FIGS. 25 and 26, the mask substrate 5 is formed thereon with a minute island transparent pattern 23 for transferring junction hole patterns to the photoresist film.

This minute island transparent pattern 23 is composed of a rectangular primary transparent pattern 23a and an auxiliary transparent pattern 23b formed in the outer periphery of the primary transparent pattern 23a but not across the opaque pattern 7.

The primary transparent pattern 23a has its size set to a slightly larger value of about 2.5 μm × 2.5 μm than the product of the size of the actual pattern to be transferred to the photoresist film on the semiconductor wafer and the reduction ratio of the reducing projection exposure optical system. In this case, the size of the pattern to be transferred to the photoresist film on the semiconductor wafer is exemplified by 0.3 μm × 0.3 μm.

Specifically, in Embodiment 4, the primary transparent pattern 23a has its size set to a slightly larger level than that of the pattern to be transferred to the photoresist film so that the focal depth of the transfer exposure plane can be increased by increasing the quantity of the transmitted light while improving the resolution of the pattern to be transferred.

The auxiliary transparent pattern 23b is formed by corrugating the mask substrate 5. In Embodiment 4, too, the light having passed through the primary transparent pattern 23a and the light having passed through the auxiliary transparent pattern 23b have their phases opposed, as in Embodiments 1 to 3.

The data of the minute island transparent pattern 23 are made in the following manner.

First of all, the actual junction hole patterns to be transferred to the photoresist film are enlarged to a predetermined extent, and the enlarged patterns are multiplied by the reduction ratio of the reducing projection exposure optical system to make the data of the primary transparent pattern 23a of a predetermined size. Subsequently, the data of the auxiliary transparent pattern 23b formed around the primary transparent pattern 23a and having a predetermined width are prepared to make the data of the minute island transparent pattern 23.

Next, the exposure processing method and the patterning method of Embodiment 4 will be described with reference to FIGS. 27 to 29.

The metal film 21c of Al or the like is deposited by the sputtering method on an insulating film $21b_1$ of $SiO_2$ or the like formed on the semiconductor substrate 21a. After this, an insulating film $21b_2$ of $SiO_2$ of the like is deposited on that metal film 21c, and the photoresist film 21d is deposited on the insulating film $216b_2$.

Subsequently, the semiconductor wafer 21 thus prepared is subjected to the baking treatment. At this time, in Embodiment 4, the baking temperature is set to a lower level than the pre-exposure baking temperature used in the phase shift mask of the prior art, in which the minute island transparent pattern 23 is not enlarged, so that the junction hole pattern to be transferred to the photoresist film 21d may not have its effective size enlarged.

After this, the phase shift mask 1 and the semiconductor wafer 21 are arranged in the predetermined positions of the reducing projection exposure apparatus 13 (as shown in FIG. 16). Then, the semiconductor wafer 21 is irradiated with the light emitted from the exposure light source 14, as shown in FIG. 27, through the phase shift mask 1. At this time, in Embodiment 4, the exposure time period is shortened more than that for using the phase shift mask of the prior art, in which the size of the minute island transparent pattern 23 is not enlarged, so that the effective size of the junction hole pattern to be transferred to the photoresist film 21d may not be enlarged.

Next, the semiconductor wafer 21 is subjected to the baking treatment. At this time, too, in Embodiment 4, the baking temperature is also lowered more than that for using the phase shift mask of the prior art, in which the size of the minute island transparent pattern 23 is not enlarged, so that the effective size of the junction hole pattern to be transferred to the photoresist film 21d may not be enlarged.

Subsequently, the photoresist film 21d on the semiconductor wafer 21 is subjected to a development to form resist patterns $21d_2$, as shown in FIG. 28.

At this time, in Embodiment 4, the developing time period is shortened by lowering the solubility of the developing liquid, for example, more than that for using the phase shift mask of the prior art, in which the size of the minute island transparent pattern 23 is not enlarged, so that the effective size of the junction hole pattern to be transferred to the photoresist film 21d may not be enlarged.

After this, the metal film 21b₂ exposed from the resist patterns 21d₂ is etched off by using the resist patterns 21d₂ as the etching mask, to form the junction hole patterns (or minute island patterns) 21e on the semiconductor wafer 21, as shown in FIG. 29.

Thus, according to Embodiment 4, the size of the primary transparent pattern 23a formed on the phase shift mask 1 is made slightly larger than that of the actual junction hole pattern 21e to be transferred to the photoresist film 21d, and the primary transparent pattern 23a is formed therearound with the auxiliary transparent pattern 23b which has its phase opposed to that of the light having passed through the primary transparent pattern 23a, so that the pattern transfer precision and the focal depth can be improved. In short, the fine patterns can be highly precisely formed to improve the reliability and production yield of the semiconductor integrated circuit device having the fine patterns.

Embodiment 5

Figure 30:
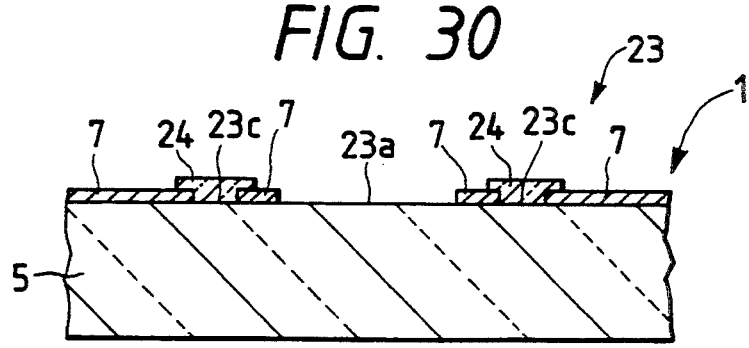
FIG. 30 is a section showing an essential portion of a phase shift mask to be used in an exposing method according to another embodiment of the present invention.
Figure 31:
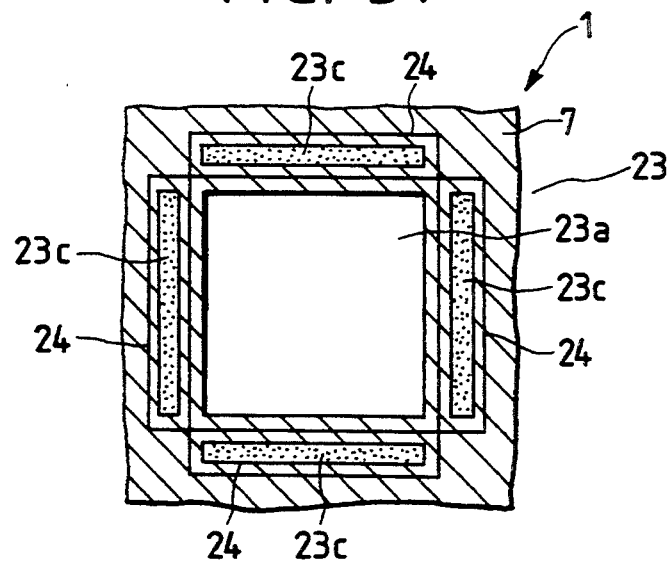
FIG. 31 is a top plan view showing an essential portion of the phase shift mask of FIG. 30.

FIG. 30 is a section showing an essential portion of a phase shift mask to be used in an exposing method according to another embodiment of the present invention, and FIG. 31 is a top plan view showing an essential portion of the phase shift mask of FIG. 30.

The phase shift mask 1 of Embodiment 5, as shown in FIGS. 30 and 31, is also formed on its mask substrate 5 with the minute island transparent pattern 23 for forming the junction hole pattern on the mask substrate 5.

In case of Embodiment 5, however, the minute island transparent pattern 23 is composed, for example, of the rectangular primary transparent pattern 23a and an auxiliary pattern (i.e., auxiliary transparent pattern) 23c arranged around the primary transparent pattern 23a and across the opaque pattern 7.

The primary transparent pattern 23a has its size set to a slightly larger value than that which is calculated by multiplying the size of the pattern to be actually transferred to the photoresist film on the semiconductor wafer by the reduction ratio of the reducing exposure optical system. The size of the primary transparent pattern 23a is exemplified by about 2.5 μm×2.5 μm. However, the size of the pattern to be transferred to the photoresist film on the semiconductor wafer is exemplified by about 0.3 μm×0.3 μm.

In Embodiment 5, too, the size of the primary transparent pattern 23a is set to a larger value than that of the pattern to be transferred to the photoresist film so that the focal depth of the transfer exposure plane can be increased while improving the resolution of the pattern to be transferred.

On the other hand, the auxiliary pattern 23c is arranged thereon with a transparent film 24 for inverting the phase of the transmitted light. As a result, the light having passed through the primary transparent pattern 23a and the light having transmitted through the auxiliary pattern 23c take the opposite phases.

The data of that minute island transparent pattern 23 are made in the following manner.

First of all, the actual junction hole pattern to be transferred to the photoresist film is enlarged to a predetermined extent. After this, the data of the primary transparent pattern 23a having a predetermined size are made by multiplying the enlarged pattern by the reduction ratio of the reducing projection exposure optical system. Subsequently, the data of the auxiliary pattern 23c having a predetermined with around the primary transparent pattern 23a and across the opaque pattern 7 are made, and the data of the minute transparent pattern 23 are made.

Thus, according to Embodiment 5, the size of the primary transparent pattern 23a formed on the phase shift mask 1 is made slightly larger than that of the actual junction hole pattern to be transferred to the photoresist film, and the auxiliary pattern 23c for inverting the phase of the transmitted light is formed around that primary transparent pattern 23a, so that the pattern transfer precision and the focal depth can be improved. That is, the fine pattern can be highly precisely formed to improve the reliability and production yield of the semiconductor integrated circuit device having the fine pattern.

Embodiment 6

Figure 32:
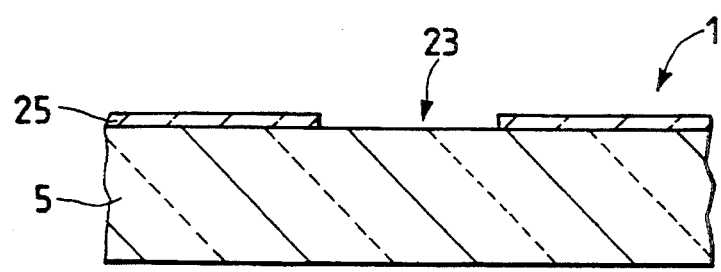
FIG. 32 is a section showing an essential portion of a phase shift mask to be used in an exposing method according to another embodiment of the present invention.
Figure 33:
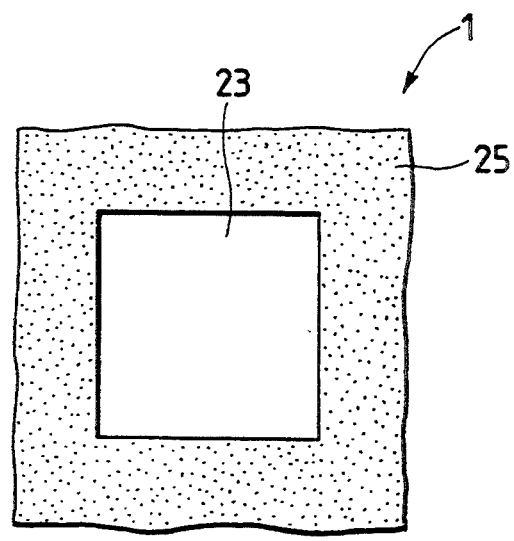
FIG. 33 is a top plan view showing an essential portion of the phase shift mask of FIG. 32.
Figure 34:
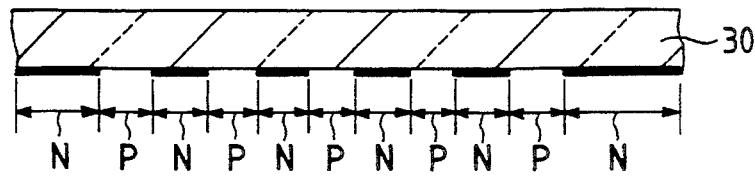
FIG. 34 is a section showing an essential portion of the ordinary photomask of the prior art.
Figure 35:
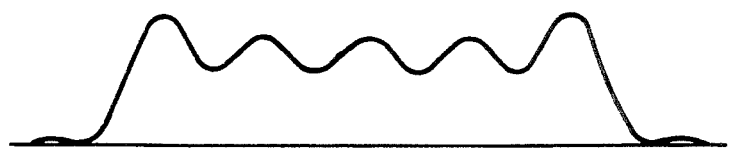
FIG. 35 is a graph plotting the intensity of a light having passed through the photomask of FIG. 34.
Figure 36:
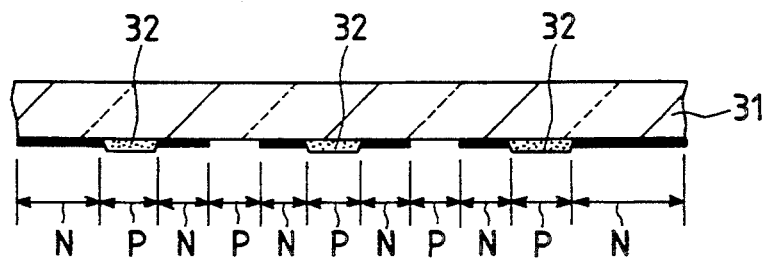
FIG. 36 is a section showing an essential portion of the phase shift mask of the prior art.

FIG. 32 is a section showing an essential portion of a phase shift mask to be used in an exposing method according to another embodiment of the present invention, and FIG. 33 is a top plan view showing an essential portion of the phase shift mask of FIG. 32.

The phase shift mask 1 of Embodiment 6, as shown in FIGS. 32 and 33, is also formed on its mask substrate 5 with the minute island transparent pattern 23 For forming the junction hole pattern. In case of Embodiment 6, however, the minute island transparent pattern 23 is formed by partially opening a semitransparent film 25 which is deposited on the mask substrate 5. This semitransparent film has a transmissivity of about ½ to 1/10, for example.

The minute island transparent pattern has its size set to a slightly larger value of about 2.5 μm×2.5 μm than the product of the size of the pattern to be actually transferred to the photoresist film on the semiconductor wafer and the reduction ratio of the reducing exposure optical system. Here, the size of the pattern to be transferred to the photoresist film on the semiconductor wafer is exemplified by about 0.3 μm×0.3μm.

In Embodiment 6, too, the size of the minute island transparent pattern 23 is set to a larger value than the size of the pattern to be transferred to the photoresist film, to increase the quantity of the transmitted light, so that the focal depth of the transfer exposure plane can be increased while improving the resolution of the pattern to be transferred.

In order to make the data of that minute island transparent pattern 23, the actual junction hole pattern to be transferred to the photoresist film is enlarged to a predetermined extent. After this, the enlarged pattern is multiplied by the reduction ratio of the reducing projection exposure optical system, to make the data of the minute island transparent pattern 23 having a predetermined size.

According to Embodiment 6, the following effects can be achieved in addition to those obtained in Embodiments 4 and 5. Specifically, the minute island transparent pattern 23 can be formed merely by removing the semitransparent film 25 partially, so that the phase shift mask 1 can be easily fabricated.

Although our invention has been specifically described in connection with its embodiments, it should not be limited to Embodiments 1 to 6 but can naturally be modified in various manners without departing from the gist thereof.

In connection with Embodiments 1 to 4, for example, the method for inverting the phase of the transmitted lights is exemplified by the method of forming grooves in the mask substrate. The present invention should not be limited to the groove forming method but may be exemplified by depositing a transparent film on the mask substrate to invert the phases of the transmitted lights. This transparent film to be used may be a Spin-On-Glass film or the like.

In Embodiment 3, on the other hand, the sizes of the individual primary transparent patterns are changed to prevent the fluctuation in the size of the transfer patterns, which might otherwise be caused by the fact that the optical intensities in the semiconductor wafer face are different between the outer periphery and the center of the semiconductor wafer. The preventing method should not be limited to the aforementioned one but can be modified in various manners. In case a transparent film is used as the phase shifting means, for example, the size of the primary transparent pattern may be changed to prevent the fluctuation in the size of the transfer pattern due to the drop in the transmissivity.

In the description thus far described, our invention has been described in case it is applied to the exposing method in the fabrication of a semiconductor integrated circuit device backgrounding the field of application of thereof. For example, the present invention can be applied to another exposing method such as one in the fabrication of a liquid crystal substrate.

The effects to be obtained by a representative of the invention disclosed herein will be briefly itemized in the following.

(1) According to the invention, even if the pitch of the plurality of repeating patterns to be transferred to the photoresist film is shorter than the exposure wavelength, the phase difference between the transmitted lights of the primary transparent pattern and the auxiliary transparent pattern and the phase difference between the transmitted lights of the adjoining primary transparent patterns can be effectively utilized by enlarging the width of the primary transparent patterns to increase the quantities of the lights to pass through the primary transparent patterns.

This can improve both the action to emphasize the edges of the patterns to be transferred, by inverting the phases of the transmitted lights of the individual repeating transparent patterns between the primary transparent patterns and the auxiliary transparent patterns, and the action to augment the intensities of the lights having passed through the two transparent patterns by inverting the phases of the lights to pass through the adjoining repeating transparent patterns.

As a result, the focal depth of the transfer exposure plane can be increased while improving the resolution of the patterns to be transferred. Thus, the fine patterns can be highly precisely formed by applying the exposing method of the present invention to the process for fabricating a semiconductor integrated circuit device, to improve the reliability and production yield of the semiconductor integrated circuit device having the fine patterns.

On the basis of the data of the patterns to be transferred, moreover, the data of the primary transparent patterns and the data of the auxiliary transparent patterns can be automatically made to facilitate the designing the pattern data of the phase shift mask. Thus, by applying the exposing method of the present invention to the process for fabricating the semiconductor integrated circuit device, the pattern data of the phase shift mask for transferring a complicated semiconductor integrated circuit pattern can be easily designed even if the semiconductor integrated circuit pattern is complicated.

What is claimed is:

1. An exposing method using, when a plurality of repeating patterns arranged in a repeating manner with a pattern pitch equal to or less than an exposure wavelength are to be transferred to a photoresist film deposited on a predetermined substrate, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another across an opaque pattern may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:

(a) a first enlarging step of making the data of said primary transparent pattern, when the pattern data on said phase shift mask are to be made, by enlarging the width of said repeating patterns on the basis of a process condition and to a predetermined extent of at least 30% in at least the direction of the repeating arrangement but without changing the relative position coordinates of said repeating patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming the phase shift mask having said repeating transparent patterns on said mask substrate, on the basis of the data of said primary transparent pattern and the data of said auxiliary transparent pattern;

(d) an exposure step of transferring said plurality of repeating transparent patterns to the photoresist film on said predetermined substrate by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and (e) a step of correcting the process condition during or before and after the exposure such that the individual effective sizes of said plurality of repeating transparent patterns to be transferred to said photoresist film may be prevented from being made larger than an object size due to said first enlarging step.

2. An exposing method according to claim 1, wherein the enlargement is at least about 50%.

3. An exposing method using, when a plurality of repeating patterns arranged in a repeating manner with a pattern pitch equal to or less than an exposure wavelength are to be transferred to a photoresist film deposited on a predetermined substrate, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another across an opaque pattern may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:
  (a) a first enlarging step of making the data of said primary transparent pattern, when the pattern data on said phase shift mask are to be made, by enlarging the individual widths of said plurality of repeating patterns on the basis of a process condition and to a predetermined extent of at least 30% in at least the direction of the repeating arrangement but without changing the relative position coordinates of said plurality of repeating patterns;
  (b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;
  (c) a step of forming said phase shift mask having said repeating transparent patterns on said mask substrate, on the basis of the data of said primary transparent pattern and the data of said auxiliary transparent pattern;
  (d) a step of registering said phase shift mask and said predetermined substrate prior to an exposure by forming an opaque pattern, which is formed on said phase shift mask, with positioning marks for registering said phase shift mask and said predetermined substrate;
  (e) an exposure step of transferring said plurality of repeating transparent patterns to the photoresist film on said predetermined substrate by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and
  (f) a step of correcting the process condition during or before and after the exposure such that the individual effective sizes of said plurality of repeating transparent patterns to be transferred to said photoresist film may be prevented from being made larger than an object size due to said first enlarging step.

4. An exposing method according to claim 3, wherein the enlargement is at least about 50%.

5. An exposing method using, when a plurality of repeating patterns arranged in a repeating manner with a pattern pitch equal to or less than an exposure wavelength are to be transferred to a photoresist film deposited on a predetermined substrate, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:
  (a) a first enlarging step of making the data of said primary transparent pattern, when the pattern data on said phase shift mask are to be made, by enlarging the width of said plurality of repeating patterns on the basis of a process condition and to a value of at least 30%, which is calculated by subtracting the width of two of said auxiliary transparent patterns from the length between said adjoining repeating patterns, in at least the direction of the repeating arrangement but without changing the relative position coordinates of said plurality of repeating patterns;
  (b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;
  (c) a step of forming the phase shift mask having a structure, in which said adjoining repeating transparent patterns are arranged directly in an adjoining state not through any opaque pattern, by arranging said primary transparent pattern and said auxiliary transparent pattern on said mask substrate on the basis of the data of said primary transparent pattern and the data of said auxiliary transparent pattern;
  (d) an exposure step of transferring said plurality of repeating transparent patterns to the photoresist film on said predetermined substrate by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and (e) a step of correcting the process condition during or before and after the exposure such that the individual effective sizes of said plurality of repeating transparent patterns to be transferred to said photoresist film may be prevented from being made larger than an object size due to said first enlarging step.

6. An exposing method according to claim 5, wherein the enlargement is at least about 50%.

7. An exposing method using, when a plurality of repeating patterns arranged in a repeating manner with a pattern pitch equal to or less than an exposure wavelength are to be transferred to a photoresist film deposited on a predetermined substrate, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:

(a) a first enlarging step of making the data of said primary transparent pattern, when the pattern data on said phase shift mask are to be made, by enlarging the width of said plurality of repeating patterns on the basis of a process condition and to a value of at least 30%, which is calculated by subtracting the width of two of said auxiliary transparent patterns from the length between said adjoining repeating patterns, in at least the direction of the repeating arrangement but without changing the relative position coordinates of said plurality of repeating patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming the phase shift mask having a structure, in which said adjoining repeating transparent patterns are arranged directly in an adjoining state not through any opaque pattern, by arranging said primary transparent pattern and said auxiliary transparent pattern on said mask substrate on the basis of the data of said primary transparent pattern and the data of said auxiliary transparent pattern;

(d) a step of registering said phase shift mask and said predetermined substrate prior to an exposure by forming an opaque pattern, which is formed on said phase shift mask, with positioning marks for registering said phase shift mask and said predetermined substrate;

(e) an exposure step of transferring said plurality of repeating transparent patterns to the photoresist film on said predetermined substrate by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and (f) a step of correcting the process condition during or before and after the exposure such that the individual effective sizes of said plurality of repeating transparent patterns to be transferred to said photoresist film may be prevented from being made larger than an object size due to said first enlarging step.

8. An exposing method according to claim 7, wherein the enlargement is at least about 50%.

9. An exposing method using, when a plurality of repeating minute island transparent patterns arranged with a minimum pattern width equal to or less than an exposure wavelength and with an adjoining pattern pitch equal to or more than the exposure wavelength are to be transferred to a photoresist film deposited on a predetermined substrate, a phase shift mask including: a primary transparent pattern so arranged on each of the plurality of repeating minute island transparent patterns arranged on a mask substrate for transferring said plurality of repeating minute island transparent patterns that the lights individually having passed through the repeating minute island transparent patterns adjoining one another across an opaque pattern may have phases inverted from each other; and an auxiliary transparent pattern so arranged in at least one portion of the outer periphery of said primary transparent pattern that its transmitted light may have a phase inverted from the phase of the light having passed through said primary transparent pattern, comprising the following steps:

(a) a first enlarging step of making the data of said primary transparent pattern, when the pattern data on said phase shift mask are to be made, by enlarging the width of said repeating minute island transparent patterns on the basis of a process condition and to a predetermined extent of at least 30% in at least the direction of the repeating arrangement but without changing the relative position coordinates of said repeating minute island transparent patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming said phase shift mask having said auxiliary transparent pattern around said primary transparent pattern, on the basis of the data of said primary transparent pattern and the data of said auxiliary transparent pattern;

(d) an exposure step of transferring said plurality of repeating minute island transparent patterns to the photoresist film on said predetermined substrate by irradiating said phase shift mask with an exposure light having a predetermined wavelength to establish an interference of the lights having passed through said primary transparent pattern and said auxiliary transparent pattern at the boundary between said primary transparent pattern and said auxiliary transparent pattern; and (e) a step of correcting the process condition during or before and after the exposure such that the individual effective sizes of said plurality of repeating minute island transparent patterns to be transferred to said photoresist film may be prevented from being made larger than an object size due to said first enlarging step.

10. An exposing method using, when a plurality of repeating minute island transparent patterns arranged with a minimum pattern width equal to or less than an exposure wavelength and with an adjoining pattern pitch equal to or more than the exposure wavelength are to be transferred to a photoresist film deposited on a predetermined substrate, a phase shift mask including: a primary transparent pattern so arranged on each of the plurality of repeating minute island transparent patterns arranged on a mask substrate for transferring said plurality of repeating minute island transparent patterns that the lights individually having passed through the repeating minute island transparent patterns adjoining one another across an opaque pattern may have phases inverted from each other; and an auxiliary transparent pattern so arranged around said primary transparent pattern and across an opaque pattern that its transmitted light may have a phase inverted from the phase of the light having passed through said primary transparent pattern, comprising the following steps:

(a) a first enlarging step of making the data of a plurality of said primary transparent patterns, when the pattern data on said phase shift mask are to be made, by enlarging the width of said repeating minute island transparent patterns on the basis of a process condition and to a predetermined extent of at least 30% in at least the direction of the repeating arrangement but without changing the relative position coordinates of said repeating minute island transparent patterns;

(b) a step of making the data of said auxiliary transparent pattern, by arranging said auxiliary transparent pattern in a predetermined position across said opaque pattern around said primary transparent pattern in the data state obtained at said first enlarging step;

(c) a step of forming said phase shift mask having said auxiliary transparent pattern around each of said plurality of primary transparent patterns, on the basis of the data of said primary transparent pattern and the data of said auxiliary transparent pattern;

(d) an exposure step of transferring said plurality of repeating minute island transparent patterns to the photoresist film on said predetermined substrate by irradiating said phase shift mask with an exposure light having a predetermined wavelength to establish an interference of the lights individually having passed through said primary transparent patterns and said auxiliary transparent pattern at the boundary between said primary transparent pattern and said auxiliary transparent pattern; and (e) a step of correcting the process condition during or before and after the exposure such that the individual effective sizes of said plurality of repeating minute island transparent patterns to be transferred to said photoresist film may be prevented from being made larger than an object size due to said first enlarging step.

11. An exposing method using, when a plurality of repeating minute island transparent patterns arranged with a minimum pattern width equal to or less than an exposure wavelength and with an adjoining pattern pitch equal to or more than the exposure wavelength are to be transferred to a photoresist film deposited on a predetermined substrate, a phase shift mask including a plurality of repeating minute island transparent patterns formed by opening a semitransparent phase inversion film on a mask substrate for transferring said plurality of repeating minute island transparent patterns, comprising the following steps:

(a) a first enlarging step of making the data of a plurality of said minute island transparent patterns, when the pattern data on said phase shift mask are to be made, by enlarging the width of said repeating minute island transparent patterns on the basis of a process condition and to a predetermined extent in at least the direction of the repeating arrangement but without changing the relative position coordinates of said repeating minute island transparent patterns;

(b) a step of forming said phase shift mask having said the plurality of repeating minute island transparent patterns, which are formed by opening the semitransparent phase inversion film on said mask substrate, on the basis of the data of said plurality of minute island transparent patterns;

(c) an exposure step of transferring said plurality of repeating minute island transparent patterns to the photoresist film on said predetermined substrate by irradiating said phase shift mask with an exposure light having a predetermined wavelength to establish an interference of the lights individually having passed through said plurality of said minute island transparent patterns and said phase inversion film; and (d) a step of correcting the process condition during or before and after the exposure such that the individual effective sizes of said plurality of repeating minute island transparent patterns to be transferred to said photoresist film may be prevented from being made larger than an object size due to said first enlarging step.

12. An exposing method according to claim 11, wherein step (a) includes enlarging the width of said repeating minute island transparent patterns to the predetermined extent of at least 30% in at least the direction of the repeating arrangement.

13. An exposing method using, when a plurality of repeating patterns arranged in a repeating manner with a pattern pitch equal to or less than an exposure wavelength are to be transferred to a photoresist film deposited on a semiconductor wafer, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another across an opaque pattern may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:

(a) a first enlarging step of making the data of said primary transparent pattern, when the pattern data on said phase shift mask are to be made, by enlarging the width of said repeating patterns on the basis of a process condition and to a predetermined extent of at least 30% in at least the direction of the repeating arrangement but without changing the relative position coordinates of said repeating patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming the phase shift mask having said repeating transparent patterns on said mask substrate, on the basis of the data of said primary transparent pattern and the data of said auxiliary transparent pattern;

(d) an exposure step of transferring said plurality of repeating transparent patterns to the photoresist film on said semiconductor wafer by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and (e) a step of correcting the process condition during or before and after the exposure such that the individual effective sizes of said plurality of repeating transparent patterns to be transferred to said photoresist film may be prevented from being made larger than an object size due to said first enlarging step.

14. An exposing method using, when a plurality of repeating patterns arranged in a repeating manner with a pattern pitch equal to or less than an exposure wavelength are to be transferred to a photoresist film deposited on a semiconductor wafer, a phase shift mask including: a primary transparent pattern so arranged on each of the plurality of repeating transparent patterns arranged on a mask substrate for transferring said plurality of repeating patterns that the lights individually having passed through the repeating transparent patterns adjoining one another may have phases inverted from each other; and an auxiliary transparent pattern so arranged in at least one portion of the outer periphery of said primary transparent pattern in each of said repeating transparent patterns that its transmitted light may have a phase inverted from the phase of the light having passed through said primary transparent pattern, comprising the following steps:

(a) a first enlarging step of making the data of said primary transparent pattern, when the pattern data on said phase shift mask are to be made, by enlarging the width of said plurality of repeating patterns on the basis of a process condition and to a value of at least 30%, which is calculated by subtracting the width of two of said auxiliary transparent patterns from the length between said adjoining repeating patterns, in at least the direction of the repeating arrangement but without changing the relative position coordinates of said plurality of repeating patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming the phase shift mask having a structure, in which said adjoining repeating transparent patterns are arranged directly in an adjoining state not through any opaque pattern, by arranging said primary transparent pattern and said auxiliary transparent pattern on said mask substrate on the basis of the data of said primary transparent pattern and the data of said auxiliary transparent pattern;

(d) an exposure step of transferring said plurality of repeating transparent patterns to the photoresist film on said semiconductor wafer by irradiating said phase shift mask with an exposure light having a predetermined wavelength to establish both an interference of the lights having passed through said primary transparent pattern and said auxiliary transparent pattern and an interference of the lights having passed through said adjoining primary transparent patterns at the boundary between said primary transparent pattern and said auxiliary transparent pattern; and (e) a step of correcting the process condition during or before and after the exposure such that the individual effective sizes of said plurality of repeating transparent patterns to be transferred to said photoresist film may be prevented from being made larger than an object size due to said first enlarging step.

15. An exposing method using, when a plurality of repeating minute island transparent patterns arranged with a minimum pattern width equal to or less than an exposure wavelength and with an adjoining pattern pitch equal to or more than the exposure wavelength are to be transferred to a photoresist film deposited on a semiconductor wafer, a phase shift mask including: a primary transparent pattern so arranged on each of the plurality of repeating minute island transparent patterns arranged on a mask substrate for transferring said plurality of repeating minute island transparent patterns that the lights individually having passed through the repeating minute island transparent patterns adjoining one another across an opaque pattern may have phases inverted from each other; and an auxiliary transparent pattern so arranged in at least one portion of the outer periphery of said primary transparent pattern that its transmitted light may have a phase inverted from the phase of the light having passed through said primary transparent pattern comprising the following steps:

(a) a first enlarging step of making the data of said primary transparent pattern, when the pattern data on said phase shift mask are to be made, by enlarging the width of said repeating minute island transparent patterns on the basis of a process condition and to a predetermined extent of at least 30% in at least the direction of the repeating arrangement but without changing the relative position coordinates of said repeating minute island transparent patterns;

(b) a second enlarging step of making the data of said auxiliary transparent pattern, by enlarging the width of said primary transparent pattern in the data state obtained at said first enlarging step to a predetermined extent on the basis of the characteristic condition of a reducing projection exposure optical system, and subsequently by eliminating the data of said primary transparent pattern from the data of the pattern obtained by the width enlargement;

(c) a step of forming said phase shift mask having said auxiliary transparent pattern around said primary transparent pattern, on the basis of the data of said primary transparent pattern and the data of said auxiliary transparent pattern;

(d) an exposure step of transferring said plurality of repeating minute island transparent patterns to the photoresist film on said semiconductor wafer by irradiating said phase shift mask with an exposure light having a predetermined wavelength to establish an interference of the lights having passed through said primary transparent pattern and said auxiliary transparent pattern at the boundary between said primary transparent pattern and said auxiliary transparent pattern; and (e) a step of correcting the process condition during or before and after the exposure such that the individual effective sizes of said plurality of repeating minute island transparent patterns to be transferred to said photoresist film may be prevented from being made larger than an object size due to said first enlarging step.

16. An exposing method using, when a plurality of repeating minute island transparent patterns arranged with a minimum pattern width equal to or less than an exposure wavelength and with an adjoining pattern pitch equal to or more than the exposure wavelength are to be transferred to a photoresist film deposited on a semiconductor wafer, a phase shift mask including: a primary transparent pattern so arranged on each of the plurality of repeating minute island transparent patterns arranged on a mask substrate for transferring said plurality of repeating minute island transparent patterns that the lights individually having passed through the repeating minute island transparent patterns adjoining one another across an opaque pattern may have phases inverted from each other; and an auxiliary transparent pattern so arranged around said primary transparent pattern and across an opaque pattern that its transmitted light may have a phase inverted from the phase of the light having passed through said primary transparent pattern, comprising the following steps:

(a) a first enlarging step of making the data of a plurality of said primary transparent patterns, when the pattern data on said phase shift mask are to be made, by enlarging the width of said repeating minute island transparent patterns on the basis of a process condition and to a predetermined extent of at least 30% in at least the direction of the repeating arrangement but without changing the relative position coordinates of said repeating minute island transparent patterns;

(b) a step of making the data of said auxiliary transparent pattern, by arranging said auxiliary transparent pattern in a predetermined position across said opaque pattern around said primary transparent pattern in the data state obtained at said first enlarging step;

(c) a step of forming said phase shift mask having said auxiliary transparent pattern around each of said plurality of primary transparent patterns, on the basis of the data of said primary transparent pattern and the data of said auxiliary transparent pattern;

(d) an exposure step of transferring said plurality of repeating minute island transparent patterns to the photoresist film on said semiconductor wafer by irradiating said phase shift mask with an exposure light having a predetermined wavelength to establish an interference of the lights individually having passed through said primary transparent patterns and said auxiliary transparent pattern at the boundary between said primary transparent pattern and said auxiliary transparent pattern; and (e) a step of correcting the process condition during or before and after the exposure such that the individual effective sizes of said plurality of repeating minute island transparent patterns to be transferred to said photoresist film may be prevented from being made larger than an object size due to said first enlarging step.

17. An exposing method using, when a plurality of repeating minute island transparent patterns arranged with a minimum pattern width equal to or less than an exposure wavelength and with an adjoining pattern pitch equal to or more than the exposure wavelength are to be transferred to a photoresist film deposited on a semiconductor wafer, a phase shift mask including a plurality of repeating minute island transparent patterns formed by opening a semitransparent phase inversion film on a mask substrate for transferring said plurality of repeating minute island transparent patterns, comprising the following steps:

(a) a first enlarging step of making the data of a plurality of said minute island transparent patterns, when the pattern data on said phase shift mask are to be made, by enlarging the width of said repeating minute island transparent patterns on the basis of a process condition and to a predetermined extent in at least the direction of the repeating arrangement but without changing the relative position coordinates of said repeating minute island transparent patterns;

(b) a step of forming said phase shift mask having said the plurality of repeating minute island transparent patterns, which are formed by opening the semitransparent phase inversion film on said mask substrate, on the basis of the data of said plurality of minute island transparent patterns;

(c) an exposure step of transferring said plurality of repeating minute island transparent patterns to the photoresist film on said semiconductor wafer by irradiating said phase shift mask with an exposure light having a predetermined wavelength to establish an interference of the lights individually having passed through said plurality of said minute island transparent patterns and said phase inversion film; and (d) a step of correcting the process condition during or before and after the exposure such that the individual effective sizes of said plurality of repeating minute island transparent patterns to be transferred to said photoresist film may be prevented from being made larger than an object size due to said first enlarging step.

18. An exposing method according to claim 17, wherein step (a) includes enlarging the width of said repeating minute island transparent patterns to the predetermined extent of at least 30% in at least the direction of the repeating arrangement.

19. A phase shift reducing projection exposure method of transferring a desired circuit pattern onto a wafer for fabricating a semiconductor integrated circuit having its primary principal surface formed with a photosensitive resist film, by forming of at least 30% enlarged opening pattern, which has an opening corresponding to said desired circuit pattern and having an inverted phase, on an opaque film on a transparent substrate, and by irradiating said enlarged opening pattern with a monochromatic exposing light to project a clear real image corresponding to said circuit pattern on said resist film overlying said wafer by a reducing projection optical system, wherein said enlarged opening pattern comprises:
(a) a first primary opening portion extending over a predetermined length with a constant width for forming a real image corresponding to itself; and
(b) a first auxiliary opening portion extending in the vicinity of or continuously of said first primary opening portion with a constant width over a predetermined length corresponding to said first primary opening portion and having a phase inverted from that of said first primary opening portion for forming no independent real image corresponding to itself, and wherein said first primary opening portion has a larger width than that of said real image focused on said wafer.

20. An optical mask for a phase shift reducing projection exposure of transferring a desired circuit pattern onto a wafer for fabricating a semiconductor integrated circuit having its primary principal surface formed with a photosensitive resist film, by forming an enlarged opening pattern, which has of at least 30% opening corresponding to said desired circuit pattern and having an inverted phase, on an opaque film on a transparent substrate, and by irradiating said enlarged opening pattern with a monochromatic exposing light to project a clear real image corresponding to said circuit pattern on said resist film overlying said wafer by a reducing projection optical system, wherein said enlarged opening pattern comprises:
(a) a first primary opening portion extending over a predetermined length with a constant width for forming a real image corresponding to itself; and
(b) a first auxiliary opening portion extending in the vicinity of or continuously of said first primary opening portion with a constant width over a predetermined length corresponding to said first primary opening portion and having a phase inverted from that of said first primary opening portion for forming no independent real image corresponding to itself, and wherein said first primary opening portion has a larger width than that of said real image focused on said wafer.

* * * * *